(12) United States Patent
Kumano et al.

(10) Patent No.: US 8,477,818 B2
(45) Date of Patent: Jul. 2, 2013

(54) GALLIUM NITRIDE-BASED SEMICONDUCTOR LASER DEVICE, AND METHOD FOR FABRICATING GALLIUM NITRIDE-BASED SEMICONDUCTOR LASER DEVICE

(75) Inventors: Tetsuya Kumano, Itami (JP); Masaki Ueno, Itami (JP); Takashi Kyono, Itami (JP); Yohei Enya, Itami (JP); Katsunori Yanashima, Kanagawa (JP); Kunihiko Tasai, Tokyo (JP); Hiroshi Nakajima, Kanagawa (JP)

(73) Assignees: Sumitomo Electric Industries, Ltd., Osaka-shi, Osaka (JP); Sony Corporation, Minato-ku, Tokyo (JP)

( * ) Notice: Subject to any disclaimer, the term of this patent is extended or adjusted under 35 U.S.C. 154(b) by 0 days.

(21) Appl. No.: 13/431,043

(22) Filed: Mar. 27, 2012

(65) Prior Publication Data
US 2013/0003769 A1   Jan. 3, 2013

(30) Foreign Application Priority Data
Jun. 29, 2011   (JP) .................................. 2011-144653

(51) Int. Cl.
*H01S 5/00*   (2006.01)

(52) U.S. Cl.
USPC .................... 372/45.01; 372/44.01; 372/43.01

(58) Field of Classification Search
USPC ................. 372/45.01, 44.01, 43.01
See application file for complete search history.

(56) References Cited

U.S. PATENT DOCUMENTS

| | | | | |
|---|---|---|---|---|
| 2006/0126688 A1* | 6/2006 | Kneissl | ...................... | 372/43.01 |
| 2010/0103970 A1* | 4/2010 | Shigihara | ................... | 372/45.01 |
| 2010/0142577 A1* | 6/2010 | Tsuda et al. | ............... | 372/45.01 |
| 2011/0073888 A1* | 3/2011 | Ueno et al. | ...................... | 257/94 |
| 2011/0076788 A1* | 3/2011 | Kyono et al. | ...................... | 438/7 |

FOREIGN PATENT DOCUMENTS

| | | |
|---|---|---|
| JP | 2006-173621 | 6/2006 |
| JP | 2008-53760 | 3/2008 |
| JP | 2010-129676 | 6/2010 |
| JP | 2010-135724 | 6/2010 |
| JP | 2011-77395 | 4/2011 |
| JP | 2011-77401 | 4/2011 |

* cited by examiner

*Primary Examiner* — Kinam Park
(74) *Attorney, Agent, or Firm* — Drinker Biddle & Reath LLP

(57) ABSTRACT

A gallium nitride-based semiconductor laser device with reduced threshold current. The gallium nitride-based semiconductor laser device is provided with an n-type cladding layer, an n-side light guide layer, an active layer, a p-side light guide layer, and a p-type cladding layer. The n-side light guide layer and the p-side light guide layer both contain indium. Each of indium compositions of the n-side light guide layer and the p-side light guide layer is not less than 2% and not more than 6%. A film thickness of the n-type cladding layer is in the range of not less than 65% and not more than 85% of a total of the film thickness of the n-type cladding layer and a film thickness of the p-type cladding layer.

26 Claims, 7 Drawing Sheets

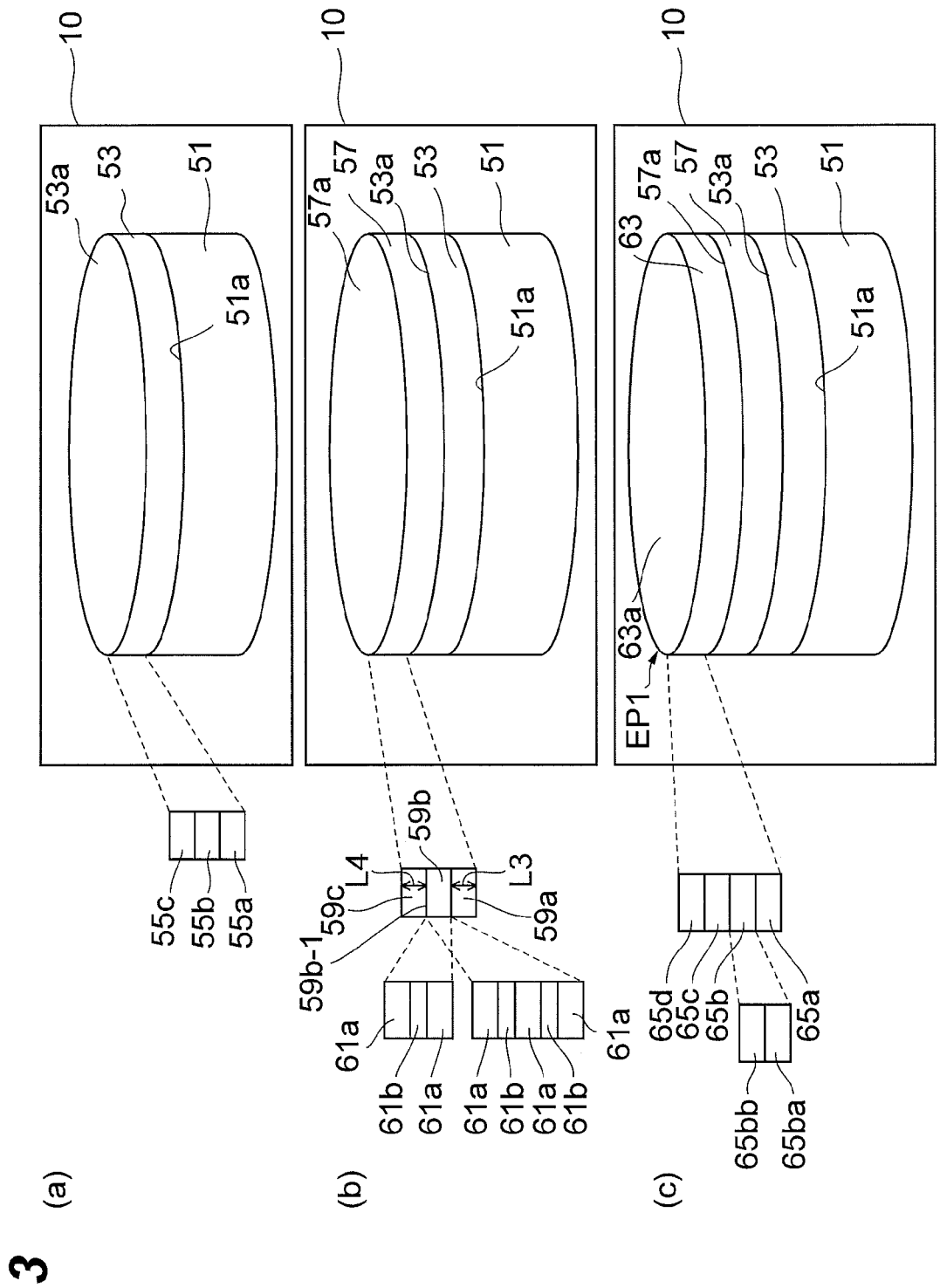

| Layer |
|---|
| p+GaN 0.010 μm |
| p+GaN 0.040 μm |
| p-In$_{0.015}$Al$_{0.07}$GaN 0.20 μm |
| p-In$_{0.03}$Al$_{0.14}$GaN 0.20 μm |
| p-GaN 0.200 μm |
| ud-In$_{0.025}$GaN 0.075 μm |
| ud-In$_{0.255}$GaN 3nm |
| n-In$_{0.025}$GaN 0.184 μm |
| n-GaN 0.250 μm |
| n-In$_{0.03}$Al$_{0.14}$GaN 1.2 μm |
| n-GaN 1.1 μm |
| GaN substrate |

(b)

| Layer |
|---|
| p+GaN 0.010 μm |
| p+GaN 0.040 μm |
| p-In$_{0.02}$Al$_{0.09}$GaN 0.40 μm |
| p-GaN 0.200 μm |
| ud-In$_{0.025}$GaN 0.075 μm |
| ud-In$_{0.255}$GaN 3nm |
| n-In$_{0.035}$GaN 0.184 μm |
| n-GaN 0.250 μm |
| n-In$_{0.02}$Al$_{0.09}$GaN 1.2 μm |
| n-GaN 1.1 μm |
| GaN substrate |

(c)

| Layer |
|---|
| p+GaN 0.010 μm |
| p+GaN 0.040 μm |
| p-In$_{0.02}$Al$_{0.09}$GaN 0.40 μm |
| p-GaN 0.200 μm |
| ud-In$_{0.03}$GaN 0.075 μm |
| ud-In$_{0.255}$GaN 3nm |
| n-In$_{0.03}$GaN 0.150 μm |
| n-GaN 0.250 μm |
| n-In$_{0.02}$Al$_{0.09}$GaN 1.2 μm |
| n-GaN 1.1 μm |
| GaN substrate |

| p+GaN 0.010 μm |
| p+GaN 0.040 μm |
| p-In$_{0.015}$Al$_{0.07}$GaN 0.40 μm |
| p-GaN 0.200 μm |
| ud-In$_{0.02}$GaN 0.075 μm |
| ud-In$_{0.255}$GaN 3nm |
| n-In$_{0.06}$GaN 0.150 μm |
| n-GaN 0.250 μm |
| n-In$_{0.02}$Al$_{0.09}$GaN 1.2 μm |
| n-GaN 1.1 μm |
| GaN substrate |

(a)

| p+GaN 0.010 μm |
| p+GaN 0.040 μm |
| p-In$_{0.015}$Al$_{0.07}$GaN 0.40 μm |
| p-GaN 0.200 μm |
| p-In$_{0.02}$GaN 0.025 μm |
| ud-In$_{0.02}$GaN 0.075 μm |
| ud-In$_{0.255}$GaN 3nm |
| n-In$_{0.045}$GaN 0.190 μm |
| n-GaN 0.250 μm |
| n-In$_{0.02}$Al$_{0.09}$GaN 1.2 μm |
| n-GaN 1.1 μm |
| GaN substrate |

GALLIUM NITRIDE-BASED SEMICONDUCTOR LASER DEVICE, AND METHOD FOR FABRICATING GALLIUM NITRIDE-BASED SEMICONDUCTOR LASER DEVICE

BACKGROUND OF THE INVENTION

1. Field of the Invention

The present invention relates to a gallium nitride (GaN)-based semiconductor laser device and a method for fabricating the GaN-based semiconductor laser device.

2. Related Background Art

Patent Literature 1 (Japanese Patent Application Laid-open No. 2010-129676) discloses a nitride semiconductor laser device with the emission wavelength of not less than 430 nm for characteristic improvements such as reduction of operating voltage, increase of external quantum efficiency, and reduction of lasing threshold current density. In this nitride semiconductor laser device, an n-type AlGaN cladding layer, a GaN layer, a first InGaN light guide layer, a light emitting layer, a second InGaN light guide layer, a nitride semiconductor intermediate layer, a p-type AlGaN layer, and a p-type AlGaN cladding layer are provided in this order on a nitride semiconductor substrate. The n-type AlGaN cladding layer has the aluminum (Al) composition of not less than 3% and not more than 5% and the thickness of not less than 1.8 μm and not more than 2.5 μm. Each of the first and second InGaN light guide layers has the indium (In) composition of not less than 3% and not more than 6%. The thickness of the first light guide layer is larger than that of the second light guide layer and is not less than 120 nm and not more than 160 nm. The p-type AlGaN layer is in contact with the p-type AlGaN cladding layer and has the aluminum (Al) composition higher than that of the p-type cladding layer and not less than 10% and not more than 35%.

SUMMARY OF THE INVENTION

In the nitride semiconductor laser device disclosed in Patent Literature 1, the film thickness of the n-side InGaN light guide layer is larger than that of the p-side InGaN light guide layer. Since the n-side light guide layer absorbs less light than the p-side light guide layer, it is conceivable to increase the film thickness of the n-side light guide layer rather than that of the p-side light guide layer, in order to decrease the threshold current. On the other hand, as the film thickness of the n-side light guide layer becomes larger than that of the p-side light guide layer, deviation of position of the active layer increases so as to decrease the ratio of light passing through the active layer, resulting in increase in threshold current on the contrary. It is therefore an object of the present invention, in view of the above circumstances, to provide a GaN-based semiconductor laser device with reduced threshold current and a method for fabricating the GaN-based semiconductor laser device.

A GaN-based semiconductor laser device according to an aspect of the present invention is a gallium nitride (GaN)-based semiconductor laser device comprising: an n-type cladding layer of an n-type GaN-based semiconductor; a first light guide layer of a GaN-based semiconductor provided on the n-type cladding layer; an active layer of a GaN-based semiconductor provided on the first light guide layer; a second light guide layer of a GaN-based semiconductor provided on the active layer; and a p-type cladding layer of a p-type GaN-based semiconductor provided on the second light guide layer, wherein a lasing wavelength of the active layer is not less than 400 nm and not more than 550 nm, wherein the first and second light guide layers both contain indium, wherein each of indium compositions of the first and second light guide layers is not less than 2% and not more than 6%, wherein a film thickness of the first light guide layer is in the range of not less than 65% and not more than 85% of a total of the film thickness of the first light guide layer and a film thickness of the second light guide layer, and wherein the first light guide layer and the second light guide layer are in contact with the active layer. Furthermore, the n-type cladding layer is $In_xAl_yGa_{1-x-y}N$ ($0<x<0.05$ and $0<y<0.20$), and the p-type cladding layer is $In_xAl_yGa_{1-x-y}N$ ($0 \leqq x<0.05$ and $0<y<0.20$).

The threshold current of the semiconductor laser can be reduced by decreasing the total quantity of light absorbed by the n-side light guide layer and the p-side light guide layer. In the first aspect of the present invention, the film thickness of the first light guide layer on the n-side is in the range of not less than 65% and not more than 85% of the total of the film thickness of the first light guide layer and the film thickness of the second light guide layer on the p-side; therefore, the total quantity of light absorbed by the n-side light guide layer and the p-side light guide layer in the GaN-based semiconductor laser device is reduced, so as to decrease the threshold current of the GaN-based semiconductor laser device, which we discovered. Since the p-type semiconductor has the light absorption coefficient larger than that of the n-type semiconductor, the quantity of light absorbed in the entire waveguide can be reduced by increasing the ratio of the n-type layer.

As the film thickness of the first light guide layer on the n-side becomes larger than that of the second light guide layer on the p-side, deviation of position of the active layer increases (to make the n-side and the p-side thereof significantly asymmetric), so as to decrease the ratio of light passing through the active layer. However, we discovered the following fact: as long as the film thickness of the first light guide layer on the n-side is in the range of not less than 65% and not more than 85% of the total of the film thickness of the first light guide layer and the film thickness of the second light guide layer on the p-side as in the first aspect of the present invention, the loss of light due to the aforementioned asymmetry between the n-side and the p-side can be suitably suppressed.

Furthermore, refractive index differences between the cladding layers and the light guides vary depending upon the indium (In) compositions of the respective cladding layers and light guide layers and the lasing wavelength, but we discovered that the loss of light can be suitably suppressed by the lasing wavelength and the indium (In) compositions according to the first aspect of the present invention.

In the device according to the first aspect of the present invention, the active layer can have a single quantum well structure including a single quantum well layer. Therefore, the device according to the first aspect of the present invention is applicable to the single quantum well structure. Possession of the quantum well enables emission of light. When the number of well layer is one, the operating voltage can be reduced by the degree of decrease of band barriers at barrier layer/well layer when compared to the case where the number of wells is two or more.

In the device according to the first aspect of the present invention, the active layer can have a multiple quantum well structure including a plurality of quantum well layers and a plurality of barrier layers. Therefore, the device according to the first aspect of the present invention is applicable to the multiple quantum well structure. Possession of the quantum wells enables emission of light. When the number of well layers is two or more, we can fabricate the laser with better optical confinement of the waveguide because of the increase in the number of wells having the higher refractive index when compared to the case where the number of well is one.

In the device according to the first aspect of the present invention, an interface between the first light guide layer and the active layer can be inclined toward the m-axis direction from a plane perpendicular to a reference axis extending along the c-axis. Therefore, the device can emit light at the emission wavelength in the range including green. Use of this plane orientation allows us to fabricate the active layer suitable for emission of light in the green region with high quality.

In the device according to the first aspect of the present invention, the interface between the first light guide layer and the active layer can be inclined at an angle of not less than 63°, and less than 80° toward the m-axis direction from the plane perpendicular to the reference axis. Therefore, the device can emit green light. Use of this plane orientation allows us to fabricate the active layer suitable for emission of light in the green region with high quality.

The device according to the first aspect of the present invention can further comprise a substrate with a principal surface of a GaN-based semiconductor, and can be configured as follows: the n-type cladding layer, the first light guide layer, the active layer, the second light guide layer, and the p-type cladding layer are provided in order on the principal surface, and the principal surface is inclined at an angle of not less than 63°, and less than 80° toward the m-axis direction from the plane perpendicular to the reference axis. Therefore, the device can emit green light. Use of this plane orientation allows us to fabricate the active layer suitable for emission of light in the green region with high quality.

In the device according to the first aspect of the present invention, the lasing wavelength of the active layer can be not less than 480 nm and not more than 550 nm, or, the lasing wavelength of the active layer can be not less than 510 nm and not more than 540 nm. Therefore, the device can emit pure green light (light at the wavelength of approximately not less than 520 nm and not more than 535 nm).

In the device according to the first aspect of the present invention, the indium composition of the first light guide layer can be not less than 2% and not more than 5%. Therefore, it is feasible to achieve a sufficient refractive index difference between the first light guide layer and the n-type cladding layer and also ensure sufficient stiffness of crystal. The indium (In) composition of not less than 2% is necessary for achieving the refractive index difference from the cladding layer enough for optical confinement, and the indium (In) composition of not more than 5% is necessary for stably preventing inclusion of misfit dislocations.

In the device according to the first aspect of the present invention, the indium composition of the first light guide layer can be not less than 2% and not more than 4.5%. Therefore, it is feasible to achieve the sufficient refractive index difference between the first light guide layer and the n-type cladding layer and also ensure sufficient stiffness of crystal. The indium (In) composition of not less than 2% is necessary for achieving the refractive index difference from the cladding layer enough for the optical confinement, and the indium (In) composition of not more than 4.5% is necessary for fully stably preventing inclusion of misfit dislocations.

In the device according to the first aspect of the present invention, the indium composition of the second light guide layer can be not less than 2% and not more than 5%. Therefore, it is feasible to achieve a sufficient refractive index difference between the second light guide layer and the p-type cladding layer and also ensure sufficient stiffness of crystal. The indium (In) composition of not less than 2% is necessary for achieving the refractive index difference from the cladding layer enough for optical confinement, and the indium (In) composition of not more than 5% is necessary for stably preventing inclusion of misfit dislocations.

In the device according to the first aspect of the present invention, the indium composition of the second light guide layer can be not less than 2% and not more than 4.5%. Therefore, it is feasible to achieve the sufficient refractive index difference between the second light guide layer and the p-type cladding layer and also ensure sufficient stiffness of crystal. The indium (In) composition of not less than 2% is necessary for achieving the refractive index difference from the cladding layer enough for the optical confinement, and the indium (In) composition of not more than 4.5% is necessary for fully stably preventing inclusion of misfit dislocations.

In the device according to the first aspect of the present invention, the sum of indium in the first light guide layer and the second light guide layer can be in the range of indium composition (%)×film thickness of guide layer (nm)≦1250. Within this range we can obtain epitaxial layers without inclusion of misfit dislocations.

A method for fabricating a GaN-based semiconductor laser device according to another aspect of the present invention is a method comprising: a step of forming an n-type cladding layer of an n-type GaN-based semiconductor; a step of forming a first light guide layer of a GaN-based semiconductor on the n-type cladding layer; a step of forming an active layer of a GaN-based semiconductor on the first light guide layer; a step of forming a second light guide layer of a GaN-based semiconductor on the active layer; and a step of forming a p-type cladding layer of a p-type GaN-based semiconductor on the second light guide layer, wherein a lasing wavelength of the active layer is not less than 400 nm and not more than 550 nm, wherein the first and second light guide layers both contain indium, wherein each of indium compositions of the first and second light guide layers is not less than 2% and not more than 6%, wherein a film thickness of the first light guide layer is in the range of not less than 65% and not more than 85% of a total of the film thickness of the first light guide layer and a film thickness of the second light guide layer, and wherein the first light guide layer and the second light guide layer are in contact with the active layer. Furthermore, the n-type cladding layer is $In_xAl_yGa_{1-x-y}N$ (0<x<0.05 and 0<y<0.20), and the p-type cladding layer is $In_xAl_yGa_{1-x-y}N$ (0≦x<0.05 and 0<y<0.20).

The threshold current of the semiconductor laser can be reduced by decreasing the total quantity of light absorbed by the n-side light guide layer and the p-side light guide layer. In the second aspect of the present invention, the film thickness of the first light guide layer on the n-side is in the range of not less than 65% and not more than 85% of the total of the film thickness of the first light guide layer and the film thickness of the second light guide layer on the p-side; therefore, the total quantity of light absorbed by the n-side light guide layer and the p-side light guide layer in the GaN-based semiconductor laser device is reduced, so as to decrease the threshold current of the GaN-based semiconductor laser device, which we discovered. Since the p-type semiconductor has the light absorption coefficient larger than that of the n-type semiconductor, the quantity of light absorbed in the entire waveguide can be reduced by increasing the ratio of the n-type layer.

As the film thickness of the first light guide layer on the n-side becomes larger than that of the second light guide layer on the p-side, deviation of position of the active layer increases (to make the n-side and the p-side thereof significantly asymmetric), so as to decrease the ratio of light passing through the active layer. However, we discovered the following fact: as long as the film thickness of the first light guide layer on the n-side is in the range of not less than 65% and not more than 85% of the total of the film thickness of the first light guide layer and the film thickness of the second light guide layer on the p-side as in the second aspect of the present invention, the loss of light due to the aforementioned asymmetry between the n-side and the p-side can be suitably suppressed.

Furthermore, refractive index differences between the cladding layers and the light guides vary depending upon the indium (In) compositions of the respective cladding layers and light guide layers and the lasing wavelength, but we discovered that the loss of light can be suitably suppressed by the lasing wavelength and the indium (In) compositions according to the second aspect of the present invention.

In the fabricating method according to the second aspect of the present invention, the active layer can have a single quantum well structure including a single quantum well layer. Therefore, the device fabricated according to the second aspect of the present invention is applicable to the single quantum well structure. Possession of the quantum well enables emission of light. When the number of well layer is one, the operating voltage can be reduced by the degree of decrease of band barriers at barrier layer/well layer when compared to the case where the number of wells is two or more.

In the fabricating method according to the second aspect of the present invention, the active layer can have a multiple quantum well structure including a plurality of quantum well layers and a plurality of barrier layers. Therefore, the device fabricated according to the second aspect of the present invention is applicable to the multiple quantum well structure. Possession of the quantum wells enables emission of light. When the number of well layers is two or more, we can fabricate the laser with better optical confinement of the waveguide because of the increase in the number of wells having the higher refractive index when compared to the case where the number of well is one.

In the fabricating method according to the second aspect of the present invention, an interface between the first light guide layer and the active layer can be inclined toward the m-axis direction from a plane perpendicular to a reference axis extending along the c-axis. Use of this plane orientation allows us to fabricate the active layer suitable for emission of light in the green region with high quality.

In the fabricating method according to the second aspect of the present invention, the interface between the first light guide layer and the active layer can be inclined at an angle of not less than 63°, and less than 80° toward the m-axis direction from the plane perpendicular to the reference axis. Use of this plane orientation allows us to fabricate the active layer suitable for emission of light in the green region with high quality.

The fabricating method according to the second aspect of the present invention can further comprise: a step of preparing a substrate with a principal surface of a GaN-based semiconductor, and can be configured as follows: the n-type cladding layer, the first light guide layer, the active layer, the second light guide layer, and the p-type cladding layer are provided in order on the principal surface of the substrate, and the principal surface is inclined at an angle of not less than 63°, and less than 80° toward the m-axis direction from the plane perpendicular to the reference axis. Use of this plane orientation allows us to fabricate the active layer suitable for emission of light in the green region with high quality.

In the fabricating method according to the second aspect of the present invention, the lasing wavelength of the active layer can be not less than 480 nm and not more than 550 nm, or, the lasing wavelength of the active layer can be not less than 510 nm and not more than 540 nm. Therefore, the device can emit pure green light (light at the wavelength of approximately not less than 520 nm and not more than 535 nm).

In the fabricating method according to the second aspect of the present invention, the indium composition of the first light guide layer can be not less than 2% and not more than 5%. Therefore, it is feasible to achieve a sufficient refractive index difference between the first light guide layer and the n-type cladding layer and also ensure sufficient stiffness of crystal. The indium (In) composition of not less than 2% is necessary for achieving the refractive index difference from the cladding layer enough for optical confinement, and the indium (In) composition of not more than 5% is necessary for stably preventing inclusion of misfit dislocations.

In the fabricating method according to the second aspect of the present invention, the indium composition of the first light guide layer can be not less than 2% and not more than 4.5%. Therefore, it is feasible to achieve the sufficient refractive index difference between the first light guide layer and the n-type cladding layer and also ensure sufficient stiffness of crystal. The indium (In) composition of not less than 2% is necessary for achieving the refractive index difference from the cladding layer enough for the optical confinement, and the indium (In) composition of not more than 4.5% is necessary for fully stably preventing inclusion of misfit dislocations.

In the fabricating method according to the second aspect of the present invention, the indium composition of the second light guide layer can be not less than 2% and not more than 5%. Therefore, it is feasible to achieve a sufficient refractive index difference between the second light guide layer and the p-type cladding layer and also ensure sufficient stiffness of crystal. The indium (In) composition of not less than 2% is necessary for achieving the refractive index difference from the cladding layer enough for optical confinement, and the indium (In) composition of not more than 5% is necessary for stably preventing inclusion of misfit dislocations.

In the fabricating method according to the second aspect of the present invention, the indium composition of the second light guide layer can be not less than 2% and not more than 4.5%. Therefore, it is feasible to achieve the sufficient refractive index difference between the second light guide layer and the p-type cladding layer and also ensure sufficient stiffness of crystal. The indium (In) composition of not less than 2% is necessary for achieving the refractive index difference from the cladding layer enough for the optical confinement, and the indium (In) composition of not more than 4.5% is necessary for fully stably preventing inclusion of misfit dislocations.

The above object and the other objects, features, and advantages of the aspects of the present invention will more readily become clear in view of the following detailed description of the preferred embodiments of the aspects of the present invention proceeding with reference to the accompanying drawings.

BRIEF DESCRIPTION OF THE DRAWINGS

FIG. 3 is a drawing schematically showing products in principal steps in the method for fabricating the GaN-based semiconductor laser device according to the embodiment.

FIG. 4 is a drawing showing device structures of laser diodes according to examples.

FIG. 5 is a drawing showing device structures of laser diodes according to examples.

DESCRIPTION OF THE PREFERRED EMBODIMENTS

Figure 1:
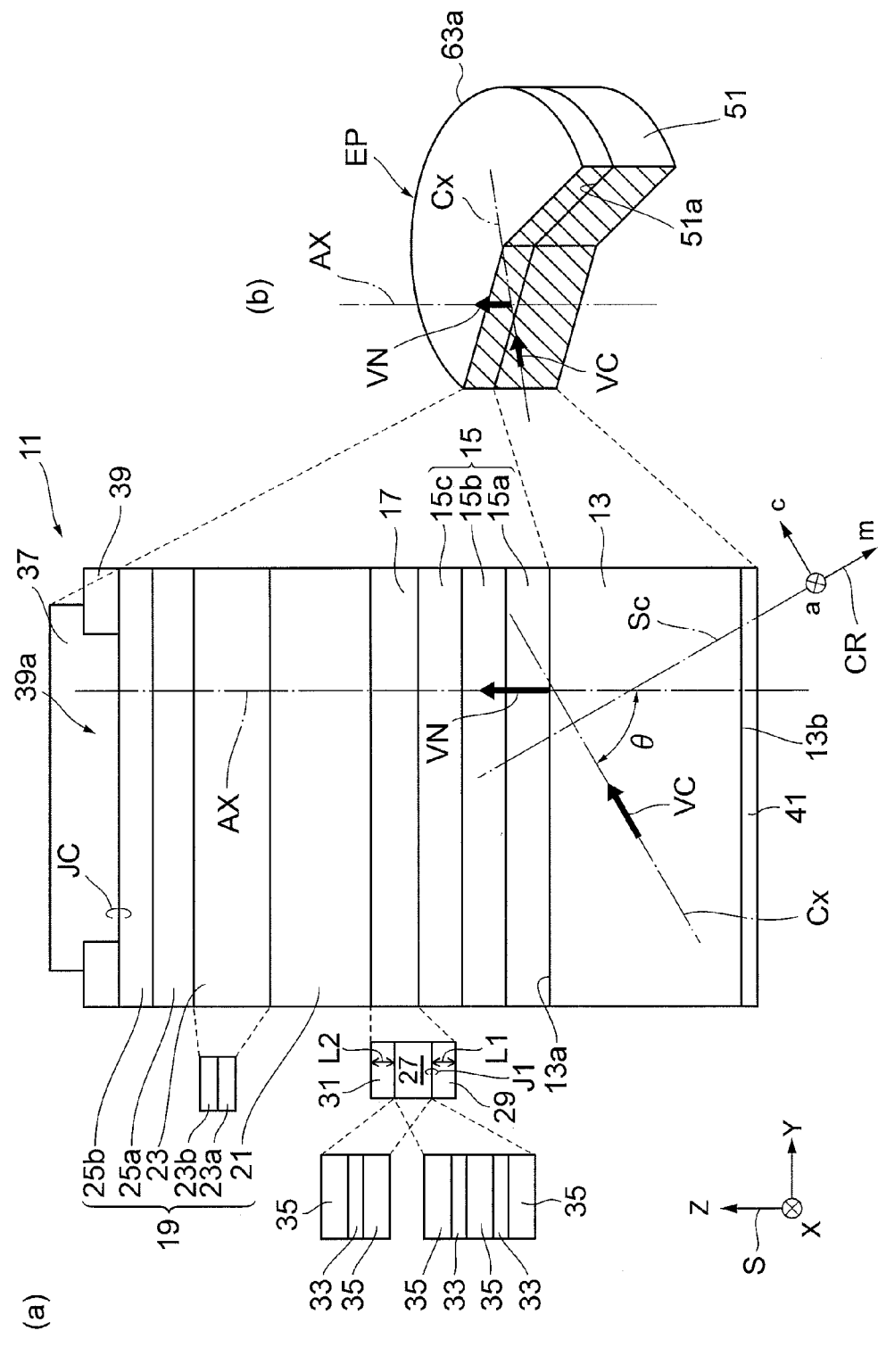
FIG. 1 is a drawing showing a configuration of a GaN-based semiconductor laser device according to an embodiment.

Embodiments will be described below in detail with reference to the drawings. In the description of the drawings the same elements will be denoted by the same reference signs as much as possible, without redundant description. FIG. 1 is a drawing schematically showing a structure of a gallium nitride (GaN)-based semiconductor laser device and a structure of an epitaxial substrate for the GaN-based semiconductor laser device according to an embodiment of the present invention.

The GaN-based semiconductor laser device 11 is shown in part (a) of FIG. 1 and the epitaxial substrate EP for the GaN-based semiconductor laser device 11 is shown in part (b) of FIG. 1. The epitaxial substrate EP has an epitaxial layer structure similar to that of the GaN-based semiconductor laser device 11. In the description hereinafter, semiconductor layers constituting the GaN-based semiconductor laser device 11 will be described. The epitaxial substrate EP includes semiconductor layers (semiconductor films) corresponding to these semiconductor layers constituting the GaN-based semiconductor laser device 11 and the description for the GaN-based semiconductor laser device 11 is applied to the corresponding semiconductor layers.

Referring to FIG. 1, there are a coordinate system S and a crystal coordinate system CR shown. A principal surface 13a of a substrate 13 is oriented in a direction of the Z-axis and extends in X- and Y-directions. The X-axis is oriented in the direction of the a-axis. As shown in part (a) of FIG. 1, the GaN-based semiconductor laser device is provided with the substrate 13, an n-type GaN-based semiconductor region 15, a light emitting layer 17, and a p-type Group III nitride semiconductor region 19. The n-type GaN-based semiconductor region 15, light emitting layer 17, and p-type Group III nitride semiconductor region 19 are formed by epitaxial growth on the substrate 13.

A c-plane of the substrate 13 extends along a plane Sc shown in FIG. 1. On the plane Sc, there is shown the crystal coordinate system CR (c-axis, a-axis, and m-axis) for indicating the crystal axes of a hexagonal GaN-based semiconductor. The principal surface 13a of the substrate 13 is inclined at an inclination angle θ toward the direction of the m-axis of the GaN-based semiconductor of the substrate 13 with respect to the plane Sc perpendicular to a reference axis Cx. The inclination angle θ is defined by an angle made between a normal vector VN to the principal surface 13a of the substrate 13 and a c-axis vector VC representing the reference axis Cx.

On the principal surface 13a, the light emitting layer 17 is provided between the n-type GaN-based semiconductor region 15 and the p-type Group III nitride semiconductor region 19. On the principal surface 13a there are the n-type GaN-based semiconductor region 15, the light emitting layer 17, and the p-type Group III nitride semiconductor region 19 arranged in order in the direction of the normal vector VN (Z-axis direction). On the principal surface 13a there are an n-type GaN-based semiconductor layer 15a, an n-type cladding layer 15b, and an n-type GaN-based semiconductor layer 15c in the n-type GaN-based semiconductor region 15 arranged in order in the direction of the normal vector VN (Z-axis direction).

On the principal surface 13a, there are an n-side light guide layer 29, an active layer 27, and a p-side light guide layer 31 in the light emitting layer 17 arranged in order in the direction of the normal vector VN (Z-axis direction). On the principal surface 13a there are a p-type GaN-based semiconductor layer 21, a p-type cladding layer 23a, a p-type cladding layer 23b, a contact layer 25a, and a contact layer 25b in the p-type Group III nitride semiconductor region 19 arranged in order in the direction of the normal vector VN (Z-axis direction). A p-type cladding layer 23 consisting of a single layer may be provided instead of the p-type cladding layer 23a and the p-type cladding layer 23b.

The substrate 13 has the principal surface 13a comprised of a GaN-based semiconductor with electrical conductivity. The principal surface 13a of the substrate 13 is inclined at an angle in the range of not less than 63°, and less than 80° from the plane Sc perpendicular to the reference axis Cx extending along the c-axis of the GaN-based semiconductor. The substrate 13 can be comprised of the GaN-based semiconductor, including the principal surface 13a. The GaN-based semiconductor of the substrate 13 can be, for example, GaN (gallium nitride), InGaN (In: indium), or AlGaN (Al: aluminum). Since GaN is a GaN-based semiconductor being a binary compound, it can provide good crystal quality and stable principal surface of substrate. The substrate 13 can also be, for example, AlN.

The n-type GaN-based semiconductor region 15 is comprised of an n-type GaN-based semiconductor. An n-type dopant in the n-type GaN-based semiconductor region 15 is, for example, silicon (Si). The n-type GaN-based semiconductor region 15 is provided on the substrate 13. The n-type GaN-based semiconductor region 15 is in direct contact with the principal surface 13a of the substrate 13. The n-type GaN-based semiconductor region 15 includes one or more n-type GaN-based semiconductor layers. The one or more n-type GaN-based semiconductor layers are provided on the principal surface 13a.

The n-type GaN-based semiconductor region 15 can include the n-type GaN-based semiconductor layer 15a, n-type cladding layer 15b, and n-type GaN-based semiconductor layer 15c. The n-type GaN-based semiconductor layer 15a is in direct contact with the principal surface 13a. The n-type GaN-based semiconductor layer 15a can be comprised, for example, of n-type GaN, InGaN, AlGaN, or InAlGaN. The n-type cladding layer 15b is provided on the n-type GaN-based semiconductor layer 15a and is in direct contact with the n-type GaN-based semiconductor layer 15a. The n-type cladding layer 15b can be comprised, for example, of n-type GaN, InGaN, AlGaN, or InAlGaN. The n-type GaN-based semiconductor layer 15c is provided on the n-type cladding layer 15b and is in direct contact with the n-type cladding layer 15b. The n-type GaN-based semiconductor layer 15c can be comprised, for example, of n-type GaN.

The light emitting layer 17 is comprised, for example, of GaN-based semiconductors containing indium (In). The light emitting layer 17 is provided on the substrate 13 and the n-type GaN-based semiconductor region 15. The light emitting layer 17 is in direct contact with the n-type GaN-based semiconductor region 15 (particularly, with the n-type GaN-based semiconductor layer 15c). Alternatively, it is in contact with the n-type GaN-based semiconductor region 15 through an undoped GaN-based semiconductor layer (barrier layer) with the film thickness of not more than 15 nm.

The light emitting layer 17 can include the active layer 27, the n-side light guide layer 29 (first light guide layer), and the p-side light guide layer 31 (second light guide layer). The active layer 27 is comprised of GaN-based semiconductors. The active layer 27 includes one or more well layers 33 and a plurality of barrier layers 35. The barrier layers 35 have the bandgap energy larger than that of the well layers 33. The active layer 27 can have a single quantum well structure including a single quantum well layer, or a multiple quantum well structure including a plurality of quantum well layers and a plurality of barrier layers.

The well layers 33 and barrier layers 35 all are provided on the n-type GaN-based semiconductor region 15 and the n-side light guide layer 29. Each of the well layers 33 and barrier layers 35 is comprised of an undoped GaN-based semiconductor, e.g., AlGaN, GaN, InGaN, or InAlGaN. The emission wavelength of the active layer 27 can be, for example, not less than 400 nm and not more than 550 nm, can be not less than 480 nm and not more than 550 nm, and can be not less than 510 nm and not more than 540 nm. When the emission wavelength is not less than 510 nm and not more than 540 nm, it is feasible to realize pure green.

The n-side light guide layer 29 is provided on the n-type GaN-based semiconductor layer 15c and is in direct contact with the n-type GaN-based semiconductor layer 15c. The n-side light guide layer 29 contains indium (In). The n-side light guide layer 29 is comprised of n-type InGaN containing an n-type dopant.

The p-side light guide layer 31 is provided on the barrier layer 35 in the active layer 27 and is in direct contact with the barrier layer 35. The p-side light guide layer 31 contains indium (In). The p-side light guide layer 31 is comprised of undoped InGaN. The p-side light guide layer 31 may have a double layer structure including an undoped InGaN layer, and an InGaN layer containing a p-type dopant, which is provided on the undoped InGaN layer.

The p-type Group III nitride semiconductor region 19 is comprised of a p-type GaN-based semiconductor. A p-type dopant in the p-type Group III nitride semiconductor region 19 is, for example, magnesium (Mg). For example, zinc (Zn) can also be used as a p-type dopant. The p-type Group III nitride semiconductor region 19 is provided on the substrate 13, the n-type GaN-based semiconductor region 15, and the light emitting layer 17. The p-type Group III nitride semiconductor region 19 is in direct contact with the light emitting layer 17. The p-type Group III nitride semiconductor region 19 includes one or more p-type GaN-based semiconductor layers. The p-type Group III nitride semiconductor region 19 can include, for example, a p-type GaN-based semiconductor layer 21.

The p-type GaN-based semiconductor layer 21 is provided on the p-side light guide layer 31 in the light emitting layer 17 and is in direct contact with the p-side light guide layer 31. The p-type GaN-based semiconductor layer 21 can be comprised, for example, of p-type GaN. Instead of the configuration wherein the p-type GaN-based semiconductor layer 21 and the p-side light guide layer 31 are in direct contact, it is also possible to adopt a configuration wherein an undoped GaN layer is provided between the p-type GaN-based semiconductor layer 21 and the p-side light guide layer 31. The p-side light guide layer 31 is in direct contact with the undoped GaN layer and the p-type GaN-based semiconductor layer 21 is also in direct contact with this undoped GaN layer.

The p-type Group III nitride semiconductor region 19 can further include, for example, the p-type cladding layer 23a, the p-type cladding layer 23b, the contact layer 25a, and the contact layer 25b. The p-type cladding layer 23a is provided on the p-type GaN-based semiconductor layer 21 and is in direct contact with the p-type GaN-based semiconductor layer 21. The p-type cladding layer 23b is provided on the p-type cladding layer 23a and is in direct contact with the p-type cladding layer 23a. The p-type cladding layer 23a and the p-type cladding layer 23b can be comprised, for example, of p-type GaN, InGaN, AlGaN, or InAlGaN. A p-type cladding layer 23 of a single layer may be used instead of the p-type cladding layer 23a and the p-type cladding layer 23b. The p-type cladding layer 23 can be comprised, for example, of p-type GaN, InGaN, AlGaN, or InAlGaN.

The p-type Group III nitride semiconductor region 19 can further include the contact layer 25a and the contact layer 25b, for example. The contact layer 25a is provided on the p-type cladding layer 23b and is in direct contact with the p-type cladding layer 23b. The contact layer 25b is provided on the contact layer 25a and is in direct contact with the contact layer 25a.

The contact layer 25a and contact layer 25b are comprised of the same p-type GaN-based semiconductor and can be comprised, for example, of p-type GaN. Since GaN is a GaN-based semiconductor being a binary compound, it can provide good crystal quality when the contact layers 25a and 25b are comprised of GaN.

A concentration of a p-type dopant in the contact layer 25a is lower than a concentration of a p-type dopant in the contact layer 25b. Since the concentration of the p-type dopant in the contact layer 25a not in direct contact with electrode 37 is relatively low, crystallinity is relatively good and therefore a carrier concentration is relatively high. Since the concentration of the p-type dopant in the contact layer 25b in direct contact with electrode 37 is relatively high, the contact resistance at contact JC with the electrode 37 is reduced. The bandgap energy of the contact layer 25a is smaller than that of the p-type cladding layer 23b. Therefore, carrier mobility through the contact layer 25a becomes good because the contact layer 25a is provided on the p-type cladding layer 23b having the bandgap energy larger than that of the contact layer 25a.

Furthermore, the GaN-based semiconductor laser device 11 has the below-described configuration in more detail. A junction J1 between the n-side light guide layer 29 and the active layer 27 is inclined toward the m-axis direction from the plane Sc perpendicular to the reference axis Cx extending along the c-axis and, particularly, can be inclined at an inclination angle θ of not less than 63°, and less than 80°.

On the principal surface 13a of the substrate 13, there are the n-type GaN-based semiconductor layer 15a, n-type cladding layer 15b, n-type GaN-based semiconductor layer 15c, n-side light guide layer 29, active layer 27, p-side light guide layer 31, p-type GaN-based semiconductor layer 21, p-type cladding layer 23a, p-type cladding layer 23b (or, the p-type cladding layer 23 instead of the p-type cladding layer 23a and the p-type cladding layer 23b), the contact layer 25a, and the contact layer 25b provided in order. The principal surface 13a of the substrate 13 is inclined at the inclination angle θ of not less than 63°, and less than 80° toward the m-axis direction from the plane Sc perpendicular to the reference axis Cx extending along the c-axis. Since the junction j1 between the n-side light guide layer 29 and the active layer 27 is inclined at the inclination angle θ of not less than 63°, and less than 80° toward the m-axis direction from the plane Sc perpendicular to the reference axis Cx extending along the c-axis, this configuration is suitable for emission of light in the green region.

The n-type cladding layer 15b is $In_xAl_yGa_{1-x-y}N$ (0<x<0.05 and 0<y<0.20) and each of the p-type cladding layer 23a, the p-type cladding layer 23b, and the p-type cladding layer 23 is $In_xAl_yGa_{1-x-y}N$ (0≦x<0.05 and 0<y<0.20).

The indium (In) compositions of the n-side light guide layer 29 and the p-side light guide layer 31 both are not less than 2% and not more than 6%, can be not less than 2% and not more than 5%, and can be not less than 2% and not more than 4.5%. The higher the indium (In) compositions of the n-side light guide layer 29 and the p-side light guide layer 31, the greater the refractive index differences from the n-type cladding layer 15b, p-type cladding layer 23a, p-type cladding layer 23b, and p-type cladding layer 23, but the more fragile their crystals are. When the principal surface 13a of the substrate 13 is inclined at the inclination angle θ of not less than 63°, and less than 80° toward the m-axis direction from the plane Sc perpendicular to the reference axis Cx extending along the c-axis, generation of dislocations becomes prominent in the range where the indium (In) composition exceeds 6%. In order to achieve sufficient refractive index differences of the n-side light guide layer 29 and the p-side light guide layer 31 from the n-type cladding layer 15b, p-type cladding layer 23a, p-type cladding layer 23b, and p-type cladding layer 23, the indium (In) compositions of the n-side light guide layer 29 and the p-side light guide layer 31 can be, particularly, not less than 2% and not more than 6%. Therefore, it is feasible to obtain the sufficient refractive index differences between the light guide layers and the cladding layers and also ensure sufficient stiffness of crystals.

The film thickness L1 of the n-side light guide layer 29 is in the range of not less than 65% and not more than 85% of a total of the film thickness L1 of the n-side light guide layer 29 and the film thickness L2 of the p-side light guide layer 31. The total of the film thickness L1 of the n-side light guide layer 29 and the film thickness L2 of the p-side light guide layer 31 can be, for example, not less than 240 nm and not more than 280 nm and, particularly, can be approximately 260 nm.

The n-type dopant in the n-type GaN-based semiconductor region 15 is, for example, silicon (Si) and a dopant concentration of the n-type dopant is approximately $5 \times 10^{17}$ cm$^{-3}$. If the dopant concentration of the n-type dopant is below this value of $5 \times 10^{17}$ cm$^{-3}$, the electrical resistance becomes relatively large. The p-type dopant in the p-type Group III nitride semiconductor region 19 is, for example, magnesium (Mg) and a dopant concentration of the p-type dopant is approximately $3 \times 10^{18}$ cm$^{-3}$. If the dopant concentration of the p-type dopant is below this value of $3 \times 10^{18}$ cm$^{-3}$, the electrical resistance becomes relatively large.

The absorption coefficient of the n-side light guide layer 29 is about 6 cm$^{-1}$, that of the p-side light guide layer 31 about 1 cm$^{-1}$, and that of the p-type GaN-based semiconductor layer 21 about 30 cm$^{-1}$. The absorption coefficients of the epitaxial layers can be measured, for example, by spectral ellipsometry.

The p-side light guide layer 31 (or the undoped InGaN layer in the case where the p-side light guide layer 31 has the double layer structure including the undoped InGaN layer, and the InGaN layer containing the p-type dopant, provided on the undoped InGaN layer) can prevent the p-type dopant, magnesium (Mg), from diffusing into the active layer. The film thickness L2 of the p-side light guide layer 31 (or the film thickness of the undoped InGaN layer in the case where the p-side light guide layer 31 has the double layer structure including the undoped InGaN layer, and the InGaN layer containing the p-type dopant, provided on the undoped InGaN layer) necessary for prevention of diffusion of magnesium (Mg) is approximately 0.075 μm; if the film thickness L2 of the p-side light guide layer 31 (or the film thickness of the undoped InGaN layer in the case where the p-side light guide layer 31 has the double layer structure including the undoped InGaN layer, and the InGaN layer containing the p-type dopant, provided on the undoped InGaN layer) exceeds this value of 0.075 μm, the p-side light guide layer 31 will have relatively high electrical resistance.

In the GaN-based semiconductor laser device 11 having the above-described configuration, the total quantity of light absorbed by the n-side light guide layer and the p-side light guide layer is reduced, so as to decrease the threshold current of the GaN-based semiconductor laser device.

In the GaN-based semiconductor laser device 11 of the present embodiment, since the film thickness L1 of the n-side light guide layer 29 is in the range of not less than 65% and not more than 85% of the total of the film thickness L1 of the n-side light guide layer 29 and the film thickness L2 of the p-side light guide layer 31, the total quantity of light absorbed by the n-side light guide layer 29 and the p-side light guide layer 31 is reduced, so as to decrease the threshold current of the GaN-based semiconductor laser device 11, which we discovered. Since the light absorption coefficient of the p-type semiconductor is larger than that of the n-type semiconductor, the overall quantity of absorbed light in the waveguide can be decreased by increasing the ratio of the n-type layer. Below-described Example 1 (a configuration shown in part (a) of FIG. 4) is provided with a 75 nm undoped layer for preventing Mg in the p-type semiconductor from diffusing into the active layer, and, for example, a guide structure with the n-side guide layer and the p-side guide layer having the same film thickness is "n-doped layer 129 nm/active layer 3 nm/undoped layer 75 nm/p-doped layer 55 nm"; Example 1 (the configuration shown in part (a) of FIG. 4) is a structure obtained by increasing the film thickness of the n-doped layer by an extent of reduction of the film thickness of the p-doped layer (to 0). This configuration can reduce the quantity of absorbed light.

As the film thickness L1 of the n-side light guide layer 29 becomes larger than the film thickness L2 of the p-side light guide layer 31, deviation of position of the active layer 27 becomes greater (to make the n-side and the p-side thereof significantly asymmetric), so as to decrease the ratio of light passing through the active layer 27; however, we found the following fact: the loss of light due to the aforementioned asymmetry between the n-side and the p-side can be suitably suppressed as long as the film thickness L1 of the n-side light guide layer 29 is in the range of not less than 65% and not more than 85% of the total of the film thickness L1 of the n-side light guide layer 29 and the film thickness L2 of the p-side light guide layer 31, as in the GaN-based semiconductor laser device 11 of the present embodiment.

We also discovered the following fact: the refractive index differences between the cladding layers and the light guides vary depending upon the respective indium (In) compositions of the cladding layers and light guide layers, and the lasing wavelength, and the loss of light can be suitably suppressed by the lasing wavelength and the indium (In) compositions of the GaN-based semiconductor laser device 11 according to the present embodiment.

The GaN-based semiconductor laser device 11 is further provided with an electrode 37 and an insulating film 39. The electrode 37 (e.g., an anode), and the insulating film 39 covering the contact layer 25b are provided on the substrate 13, the n-type GaN-based semiconductor region 15, the light emitting layer 17, and the p-type Group III nitride semiconductor region 19. The electrode 37 is provided on the contact layer 25b and is in direct contact with the contact layer 25b through an aperture 39a of the insulating film 39. The contact layer 25b and the electrode 37 make a contact JC through the aperture 39a. The electrode 37 is comprised, for example, of Pd, Au, or Ni/Au (Ni and Au). Therefore, the electrode 37 of such material realizes good contact with the contact layer 25b.

The GaN-based semiconductor laser device 11 is provided with an electrode 41 (e.g., a cathode). The electrode 41 is provided on a back surface 13b of the substrate 13 and is in direct contact with the back surface 13b. The electrode 41 is comprised, for example, of Ti/Al.

As shown in part (b) of FIG. 1, the epitaxial substrate EP of the GaN-based semiconductor laser device 11 includes the semiconductor layers (semiconductor films) corresponding to the above-described respective semiconductor layers of the GaN-based semiconductor laser device 11, and the description for the GaN-based semiconductor laser device 11 applies to the corresponding semiconductor layers.

Figure 2:
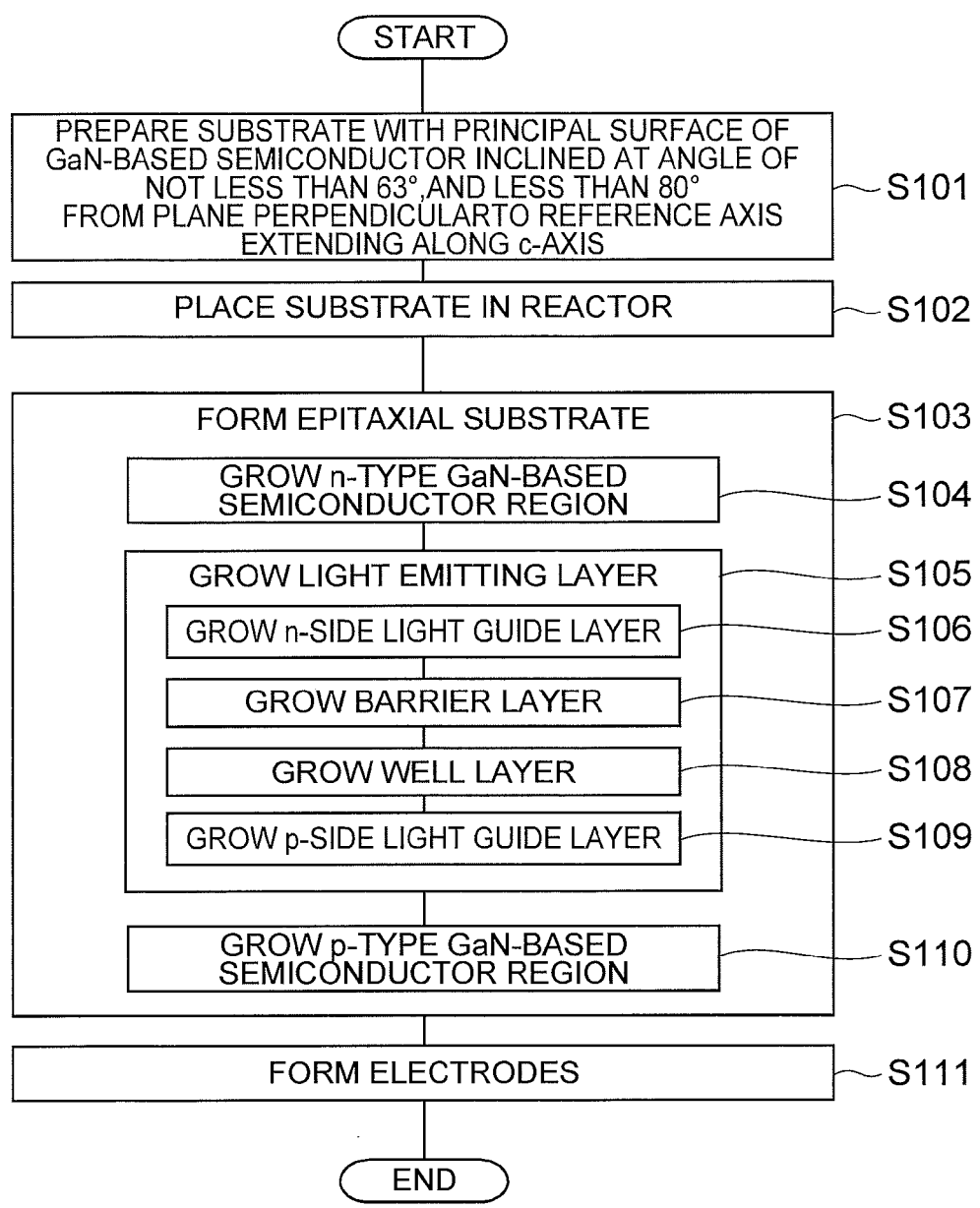
FIG. 2 is a drawing showing principal steps in a method for fabricating a GaN-based semiconductor laser device according to an embodiment.

FIG. 2 is a drawing showing principal steps in a method for fabricating a GaN-based semiconductor laser device according to the present embodiment. FIG. 3 is a drawing schematically showing products in principal steps of the method for fabricating the GaN-based semiconductor laser device according to the present embodiment. In accordance with the step flow shown in FIG. 2, the epitaxial substrate EP and the GaN-based semiconductor laser device 11 were fabricated in the structure of a light emitting device by metal organic vapor phase epitaxy. Raw materials used for the epitaxial growth were trimethylgallium (TMG), trimethylindium (TMI), trimethylaluminum (TMA), ammonia ($NH_3$), silane ($SiH_4$), and bis(cyclopentadienyl)magnesium ($Cp_2Mg$).

Step S101 is to prepare a substrate (substrate 51 shown in part (a) of FIG. 3) having a principal surface (principal surface 51a shown in part (a) of FIG. 3) comprised of a GaN-based semiconductor. A normal axis (normal axis Ax) to the principal surface 51a (corresponding to the principal surface 13a) of this substrate 51 (corresponding to the substrate 13) has an inclination angle (corresponding to the inclination angle θ) in the range of not less than 63°, and less than 80° with respect to the reference axis (reference axis Cx) extending along the c-axis of the GaN-based semiconductor. The principal surface 51a of the substrate 51 can be, for example, a {20-21} plane inclined at the angle of 75° from a c-plane toward the m-axis direction in hexagonal GaN. The principal surface 51a is mirror polished.

Next, epitaxial growth is carried out under the below conditions on the principal surface 51a of the substrate 51. First, step S102 is to place the substrate 51 in a reactor 10. In the reactor 10 a quartz jig, e.g., a quartz flow channel or the like is arranged. If needed, a thermal treatment is carried out at the temperature of about 1050° C. and in-reactor pressure of about 27 kPa for about ten minutes, while supplying a thermal treatment gas containing $NH_3$ and $H_2$, into the reactor 10. This thermal treatment results in surface modification in the principal surface 51a and others.

After this thermal treatment, step S103 is to epitaxially grow GaN-based semiconductor layers on the principal surface 51a of the substrate 51, thereby forming the epitaxial substrate EP. An atmosphere gas can contain, for example, nitrogen and/or hydrogen. Step S103 includes step S104, step S105, and step S110 described below.

As shown in part (a) of FIG. 3, step S104 is to supply a source gas containing raw materials for Group III and Group V constituent elements, and an n-type dopant, and the atmosphere gas into the reactor 10 to form an n-type GaN-based semiconductor region 53 (corresponding to the n-type GaN-based semiconductor region 15) by epitaxial growth on the principal surface 51a of the substrate 51. An inclination angle of a principal surface 53a of the n-type GaN-based semiconductor region 53 corresponds to the inclination angle (inclination angle θ) of the principal surface 51a of the substrate 51.

The n-type GaN-based semiconductor region 53 can include one or more Group III nitride semiconductor layers. In the present embodiment, for example, Group III nitride semiconductor layers described below (Si-doped GaN-based semiconductor layer 55a, Si-doped GaN-based semiconductor cladding layer 55b, and Si-doped GaN-based semiconductor layer 55c) are grown in order.

At about 950° C., for example, TMG, $NH_3$, $SiH_4$, and, nitrogen and/or hydrogen are supplied into the reactor 10 to grow and form an Si-doped GaN-based semiconductor layer 55a (corresponding to the n-type GaN-based semiconductor layer 15a). In this case, the Si-doped GaN-based semiconductor layer 55a can be comprised of n-type GaN.

Next, at the substrate temperature of about 870° C., for example, TMG, TMI, TMA, $NH_3$, $SiH_4$, and nitrogen are supplied into the reactor 10 to grow and form an Si-doped GaN-based semiconductor cladding layer 55b (corresponding to the n-type cladding layer 15b). In this case, the Si-doped GaN-based semiconductor cladding layer 55b can be comprised of n-type InAlGaN.

After this, at about 1050° C., for example, TMG, $NH_3$, $SiH_4$, and, nitrogen and/or hydrogen are supplied into the reactor 10 to grow and form an Si-doped GaN-based semiconductor layer 55c (corresponding to the n-type GaN-based semiconductor layer 15c). In a hydrogen atmosphere having a reducing property, oxygen becomes easier to desorb from the jig and deposits thereon in the reactor 10. As described above, the Si-doped GaN-based semiconductor layer 55a, Si-doped GaN-based semiconductor cladding layer 55b, and Si-doped GaN-based semiconductor layer 55c are successively formed on the principal surface 51a of the substrate 51.

The film thickness of the Si-doped GaN-based semiconductor layer 55a is about 1.1 µm. The film thickness of the Si-doped GaN-based semiconductor cladding layer 55b is about 1.2 µm. The film thickness of the Si-doped GaN-based semiconductor layer 55c is about 0.250 µm.

In step S105, as shown in part (b) of FIG. 3, a light emitting layer 57 (corresponding to the light emitting layer 17) is formed by epitaxial growth on the principal surface 53a of the n-type GaN-based semiconductor region 53. Step S105 includes Steps S106 to S109 described below.

In step S106, for example, TMG, TMI, $NH_3$, $SiH_4$, and nitrogen are supplied into the reactor 10 at the substrate temperature of about 840° C. to grow and form an n-type light guide layer 59a (corresponding to the n-side light guide layer 29) on the principal surface 53a. In this case, the light guide layer 59a can be comprised of n-type InGaN containing indium (In). The film thickness L3 of the light guide layer 59a is about 0.184 µm.

Next, steps S107 and S108 are to grow and form an active layer 59b (corresponding to the active layer 27) on the light guide layer 59a. Step S107 is, for example, to supply TMG, TMI, $NH_3$, and the atmosphere gas of nitrogen into the reactor 10 to grow and form a barrier layer 61a (corresponding to the barrier layer 35). In this case, the barrier layer 61a can be comprised of undoped InGaN. The thickness of the barrier layer 61a is about 15 nm.

After the growth of the barrier layer 61a, the growth is suspended and the substrate temperature is changed from the growth temperature for the barrier layer to the growth temperature for well layer. In step S108 after the change of substrate temperature, for example, TMG, TMI, NH₃, and the atmosphere gas of nitrogen are supplied into the reactor 10 to grow and form a well layer 61b (corresponding to the well layer 33). In this case, the well layer 61b can be comprised of undoped InGaN. The thickness of the well layer 61b is about 3 nm.

If needed, the growth of barrier layer, the temperature change, and the growth of well layer can be repeatedly carried out. In the present embodiment, the quantum well structure of the active layer 59b is a single quantum well structure including a single well layer 61b, or a multiple quantum well structure containing a plurality of well layers 61b (e.g., three well layers).

In step S109, for example, TMG, TMI, NH₃, and the atmosphere gas of nitrogen are supplied into the reactor 10 at the substrate temperature of about 840° C. to grow and form a p-side light guide layer 59c (corresponding to the p-side light guide layer 31) on a principal surface 59b-1 of the active layer 59b. In this case, the light guide layer 59c can be comprised of undoped InGaN containing indium (In). Each of inclination angles of the principal surface 57a of the light emitting layer 57 and the principal surface 59b-1 of the active layer 59b corresponds to the inclination angle (inclination angle θ) of the principal surface 51a of the substrate 51. The film thickness L4 of the light guide layer 59c is about 0.075 μm. The p-side light guide layer 59c can have a double layer structure including an undoped InGaN layer, and an InGaN layer containing a p-type dopant, which is provided on the undoped InGaN layer. When the p-side light guide layer 59c has the double layer structure as described above, the undoped InGaN layer is in contact with the principal surface 59b-1 of the active layer 59b, the film thickness of the undoped InGaN layer is about 0.075 μm, and the film thickness of the InGaN layer containing the p-type dopant is about 0.025 μm.

When the film thickness L3 of the light guide layer 59a is about 0.184 μm, the total of the film thickness L3 of the light guide layer 59a (about 0.184 μm) and the film thickness L4 of the light guide layer 59c (about 0.075 μm) is approximately 0.259 μm and, therefore, the film thickness L3 of the light guide layer 59a is about 71% of the total of the film thickness L3 of the light guide layer 59a and the film thickness L4 of the light guide layer 59c.

When the film thickness L3 of the light guide layer 59a is about 0.150 μm, the total of the film thickness L3 of the light guide layer 59a (about 0.150 μm) and the film thickness L4 of the light guide layer 59c (about 0.075 μm) is approximately 0.225 μm and therefore the film thickness L3 of the light guide layer 59a is approximately 67% of the total of the film thickness L3 of the light guide layer 59a and the film thickness L4 of the light guide layer 59c.

In step S110, as shown in part (c) of FIG. 3, a source gas containing a Group III raw material, a Group V raw material, and a p-type dopant, and the atmosphere gas are supplied into the reactor 10 to form a p-type Group III nitride semiconductor region 63 (corresponding to the p-type Group III nitride semiconductor region 19) by epitaxial growth on the principal surface 57a of the light emitting layer 57. An inclination angle of a principal surface 63a of the p-type Group III nitride semiconductor region 63 corresponds to the inclination angle (inclination angle θ) of the principal surface 51a of the substrate 51.

The p-type Group III nitride semiconductor region 63 can include one or more Group III nitride semiconductor layers. In the present example, Group III nitride semiconductor layers described below (Mg-doped GaN-based semiconductor layer 65a, Mg-doped GaN-based semiconductor cladding layer 65ba, Mg-doped GaN-based semiconductor cladding layer 65bb, Mg-doped GaN-based semiconductor contact layer 65c, and Mg-doped GaN-based semiconductor contact layer 65d) are grown in order.

For example, after the growth of the light emitting layer 57, the supply of TMG is terminated and the substrate temperature is increased. At about 900° C., for example, TMG, NH₃, Cp₂Mg, and the atmosphere gas are supplied into the reactor 10 to grow and form an Mg-doped GaN-based semiconductor layer 65a (corresponding to the p-type GaN-based semiconductor layer 21) on the principal surface 57a of the light emitting layer 57. In this case, the Mg-doped GaN-based semiconductor layer 65a can be comprised of p-type GaN. In the growth of the Mg-doped GaN-based semiconductor layer 65a, it is preferable to supply nitrogen as the atmosphere gas.

An undoped GaN layer may be grown on the light guide layer 59c (or on the principal surface 57a of the light emitting layer 57), prior to the growth of the Mg-doped GaN-based semiconductor layer 65a. In this case, the Mg-doped GaN-based semiconductor layer 65a is formed on this undoped GaN layer.

Thereafter, at the substrate temperature of about 870° C., for example, TMG, TMI, TMA, NH₃, Cp₂Mg, and nitrogen are supplied into the reactor 10 to grow and form an Mg-doped GaN-based semiconductor cladding layer 65ba (corresponding to the p-type cladding layer 23a) on the Mg-doped GaN-based semiconductor layer 65a. Then, after the growth of the Mg-doped GaN-based semiconductor cladding layer 65ba, for example, supply amounts of TMG, TMI, and TMA are changed to grow and form an Mg-doped GaN-based semiconductor cladding layer 65bb (corresponding to the p-type cladding layer 23b) on the Mg-doped GaN-based semiconductor cladding layer 65ba. In this case, the Mg-doped GaN-based semiconductor cladding layer 65ba and the Mg-doped GaN-based semiconductor cladding layer 65bb can be comprised each of p-type InAlGaN.

It is noted that, after the growth of the Mg-doped GaN-based semiconductor layer 65a, a single layer of Mg-doped GaN-based semiconductor cladding layer 65b (corresponding to the p-type cladding layer 23) may be grown and formed, instead of the formation of the two cladding layers of the Mg-doped GaN-based semiconductor cladding layer 65ba and the Mg-doped GaN-based semiconductor cladding layer 65bb, on the Mg-doped GaN-based semiconductor layer 65a. The Mg-doped GaN-based semiconductor cladding layer 65b can be comprised of p-type InAlGaN as the Mg-doped GaN-based semiconductor cladding layer 65ba and the Mg-doped GaN-based semiconductor cladding layer 65bb.

After the growth of the Mg-doped GaN-based semiconductor cladding layer 65bb (or the Mg-doped GaN-based semiconductor cladding layer 65b), an Mg-doped GaN-based semiconductor contact layer 65c (corresponding to the contact layer 25a) is formed by epitaxial growth on the Mg-doped GaN-based semiconductor cladding layer 65bb (or on the Mg-doped GaN-based semiconductor cladding layer 65b). Then, after the growth of the Mg-doped GaN-based semiconductor contact layer 65c, the supply amount of the p-type dopant is changed and an Mg-doped GaN-based semiconductor contact layer 65d (corresponding to the contact layer 25b) is formed by epitaxial growth on the Mg-doped GaN-based semiconductor contact layer 65c.

First, at about 900° C., for example, TMG, NH₃, Cp₂Mg, and the atmosphere gas are supplied into the reactor 10 to grow and form the Mg-doped GaN-based semiconductor contact layer 65c. In this case, the Mg-doped GaN-based semiconductor contact layer 65c can be comprised of p-type GaN. An Mg concentration of the Mg-doped GaN-based semiconductor contact layer 65c is, for example, about $1\times10^{19}$ cm$^{-3}$. After completion of the growth of the Mg-doped GaN-based semiconductor contact layer 65c, the supply amount of the p-type dopant (Mg) is changed, for example, from 1 sccm to 500 sccm and thereafter, at about 900° C., for example, TMG, NH$_3$, Cp$_2$Mg, and the atmosphere gas are supplied into the reactor 10 to grow and form the Mg-doped GaN-based semiconductor contact layer 65d. In this case, the Mg-doped GaN-based semiconductor contact layer 65d can be comprised of p-type GaN. An Mg concentration of the Mg-doped GaN-based semiconductor contact layer 65d is, for example, about $5\times10^{20}$ cm$^{-3}$.

The supply amount of Mg to be supplied during the growth of the Mg-doped GaN-based semiconductor contact layer 65d may be larger than that of Mg to be supplied during the growth of the Mg-doped GaN-based semiconductor contact layer 65c. In this case, the concentrations of the p-type dopant (Mg) are such that the concentration in the Mg-doped GaN-based semiconductor contact layer 65d is higher than that in the Mg-doped GaN-based semiconductor contact layer 65c. In the growth steps of the Mg-doped GaN-based semiconductor contact layer 65c and the Mg-doped GaN-based semiconductor contact layer 65d, it is preferable to supply nitrogen as the atmosphere gas.

The growth temperatures for the Mg-doped GaN-based semiconductor contact layer 65c and the Mg-doped GaN-based semiconductor contact layer 65d may be the same temperature, about 1000° C. The growth temperatures for the Mg-doped GaN-based semiconductor contact layer 65c and the Mg-doped GaN-based semiconductor contact layer 65d can be higher than that for the active layer 59b. The difference between the growth temperature for the Mg-doped GaN-based semiconductor contact layer 65c and the Mg-doped GaN-based semiconductor contact layer 65d and the growth temperature for the active layer 59b can be, for example, in the range of not less than 150° C. and not more than 300° C. If the difference between the growth temperatures is smaller than the difference of 150° C., electrical characteristics will degrade because of the low growth temperature for the Mg-doped GaN-based semiconductor contact layer 65c and the Mg-doped GaN-based semiconductor contact layer 65d. If the difference between the growth temperatures is larger than the difference of 300° C., thermal damage will increase to the active layer 59b so as to result in decrease in emission efficiency.

The film thickness of the Mg-doped GaN-based semiconductor layer 65a is about 0.200 μm. The film thickness of the Mg-doped GaN-based semiconductor cladding layer 65ba is about 0.20 μm. The film thickness of the Mg-doped GaN-based semiconductor cladding layer 65bb is about 0.20 μm. The film thickness of the Mg-doped GaN-based semiconductor cladding layer 65b is about 0.40 μm. The film thickness of the Mg-doped GaN-based semiconductor contact layer 65c is about 0.040 μm. The film thickness of the Mg-doped GaN-based semiconductor contact layer 65d is about 0.010 μm. After the steps S101 to S110 described above, an epitaxial substrate EP1 is obtained. The surface roughness of the epitaxial substrate EP1 has the arithmetic average roughness of not more than 1 nm in a 10 μm-square region.

In step S111, electrodes are formed on the epitaxial substrate EP1 (particularly, on the Mg-doped GaN-based semiconductor contact layer 65d). The electrodes are formed as described below. For example, an electrode of metal such as Ni/Au or Pd (corresponding to the electrode 37) is formed on the Mg-doped GaN-based semiconductor contact layer 65d and an electrode of metal such as Ti/Al (corresponding to the electrode 41) is formed on a back surface of the epitaxial substrate EP1. Prior to the formation of the electrodes, the epitaxial substrate EP1 can be processed to form a ridge structure. Step S111 results in forming the epitaxial substrate EP. Then a laser bar is formed from the epitaxial substrate EP by cleavage and a reflecting film comprised of a dielectric multilayer film (e.g., SiO$_2$/TiO$_2$) is deposited on each of end faces of a resonator for the laser bar, followed by separation to the GaN-based semiconductor laser device 11.

Example 1

A laser diode (corresponding to the GaN-based semiconductor laser device 11) was fabricated in the device structure shown in part (a) of FIG. 4. A GaN substrate with a principal surface of a GaN-based semiconductor was prepared and an epitaxial lamination of GaN-based semiconductors was formed on the principal surface of this GaN substrate by metal organic vapor phase epitaxy. First, a first n-GaN layer was formed by epitaxial growth in the thickness of about 1.1 μm on the principal surface of the GaN substrate. Then, after the formation of the first n-GaN layer, an n-InAlGaN layer (having the indium (In) composition of about 0.03 and the aluminum (Al) composition of about 0.14) as an n-type cladding layer was formed by epitaxial growth in the thickness of about 1.2 μm on the first n-GaN layer.

Next, a second n-GaN layer was formed by epitaxial growth in the thickness of about 0.250 μm on the n-InAlGaN layer. Thereafter, an n-InGaN layer (having the indium (In) composition of about 0.025) as an n-side light guide layer was formed by epitaxial growth in the thickness of about 0.184 μm on the second n-GaN layer.

Next, an undoped ud-InGaN layer (having the indium (In) composition of about 0.255) as an active layer was formed by epitaxial growth in the thickness of about 3 nm on the n-InGaN layer. Thereafter, an undoped ud-InGaN layer (having the indium (In) composition of about 0.025) as a p-side light guide layer was formed by epitaxial growth in the thickness of about 0.075 μm on the active layer. Subsequently, a p-GaN layer was formed by epitaxial growth in the thickness of about 0.200 μm on the undoped ud-InGaN layer as the p-side light guide layer.

Next, first and second p-InAlGaN layers were formed as p-type cladding layer on the p-GaN layer. First, the first p-InAlGaN layer (having the indium (In) composition of about 0.03 and the aluminum (Al) composition of about 0.14) was formed by epitaxial growth in the thickness of about 0.20 μm on the p-GaN layer and, thereafter, supply amounts of raw materials were changed. Then the second p-InAlGaN layer (having the indium (In) composition of about 0.015 and the aluminum (Al) composition of about 0.07) was formed by epitaxial growth in the thickness of about 0.20 μm on the first p-InAlGaN layer.

Next, a contact layer consisting of a first p$^+$-GaN layer and a second p$^+$-GaN layer having a p-type dopant concentration equal to or higher than that of the first p$^+$-GaN layer was formed on the p-type cladding layer (particularly, on the second p-InAlGaN layer). First, the first p$^+$-GaN layer was formed by epitaxial growth in the thickness of about 0.040 μm on the second p-InAlGaN layer and, thereafter, the second p$^+$-GaN layer having the p-type dopant concentration higher than that of the first p$^+$-GaN layer was formed by epitaxial growth in the thickness of about 0.010 μm on the first p$^+$-GaN layer. In the manner described above, the epitaxial lamination of GaN-based semiconductors was formed on the principal surface of the GaN substrate.

Example 2

A laser diode (corresponding to the GaN-based semiconductor laser device 11) was fabricated in the device structure shown in part (b) of FIG. 4. A GaN substrate with a principal surface of a GaN-based semiconductor was prepared and an epitaxial lamination of GaN-based semiconductors was formed on the principal surface of this GaN substrate by metal organic vapor phase epitaxy. First, a first n-GaN layer was formed by epitaxial growth in the thickness of about 1.1 μm on the principal surface of the GaN substrate. Then, after the formation of the first n-GaN layer, an n-InAlGaN layer (having the indium (In) composition of about 0.02 and the aluminum (Al) composition of about 0.09) as an n-type cladding layer was formed by epitaxial growth in the thickness of about 1.2 μm on the first n-GaN layer.

Next, a second n-GaN layer was formed by epitaxial growth in the thickness of about 0.250 μm on the n-InAlGaN layer. Thereafter, an n-InGaN layer (having the indium (In) composition of about 0.035) as an n-side light guide layer was formed by epitaxial growth in the thickness of about 0.184 μm on the second n-GaN layer.

Next, an undoped ud-InGaN layer (having the indium (In) composition of about 0.255) as an active layer was formed by epitaxial growth in the thickness of about 3 nm on the n-InGaN layer. Thereafter, an undoped ud-InGaN layer (having the indium (In) composition of about 0.025) as a p-side light guide layer was formed by epitaxial growth in the thickness of about 0.075 μm on the active layer. Subsequently, a p-GaN layer was formed by epitaxial growth in the thickness of about 0.200 μm on the undoped ud-InGaN layer as the p-side light guide layer. Subsequently, a p-InAlGaN layer (having the indium (In) composition of about 0.02 and the aluminum (Al) composition of about 0.09) as a p-type cladding layer was formed by epitaxial growth in the thickness of about 0.40 μm on the p-GaN layer.

Next, a contact layer consisting of a first p$^+$-GaN layer and a second p$^+$-GaN layer having a p-type dopant concentration equal to or higher than that of the first p$^+$-GaN layer was formed on the p-type cladding layer (particularly, on the second p-InAlGaN layer). First, the first p$^+$-GaN layer was formed by epitaxial growth in the thickness of about 0.040 μm on the second p-InAlGaN layer and, thereafter, the second p$^+$-GaN layer having the p-type dopant concentration higher than that of the first p$^+$-GaN layer was formed by epitaxial growth in the thickness of about 0.010 μm on the first p$^+$-GaN layer. In the manner described above, the epitaxial lamination of GaN-based semiconductors was formed on the principal surface of the GaN substrate.

Example 3

A laser diode (corresponding to the GaN-based semiconductor laser device 11) was fabricated in the device structure shown in part (c) of FIG. 4. A GaN substrate with a principal surface of a GaN-based semiconductor was prepared and an epitaxial lamination of GaN-based semiconductors was formed on the principal surface of this GaN substrate by metal organic vapor phase epitaxy. First, a first n-GaN layer was formed by epitaxial growth in the thickness of about 1.1 μm on the principal surface of the GaN substrate. Then, after the formation of the first n-GaN layer, an n-InAlGaN layer (having the indium (In) composition of about 0.02 and the aluminum (Al) composition of about 0.09) as an n-type cladding layer was formed by epitaxial growth in the thickness of about 1.2 μm on the first n-GaN layer.

Next, a second n-GaN layer was formed by epitaxial growth in the thickness of about 0.250 μm on the n-InAlGaN layer. Thereafter, an n-InGaN layer (having the indium (In) composition of about 0.03) as an n-side light guide layer was formed by epitaxial growth in the thickness of about 0.150 μm on the second n-GaN layer. Next, an undoped ud-InGaN layer (having the indium (In) composition of about 0.255) as an active layer was formed by epitaxial growth in the thickness of about 3 nm on the n-InGaN layer.

Thereafter, an undoped ud-InGaN layer (having the indium (In) composition of about 0.03) as a p-side light guide layer was formed by epitaxial growth in the thickness of about 0.075 μm on the active layer. Subsequently, a p-GaN layer was formed by epitaxial growth in the thickness of about 0.200 μm on the undoped ud-InGaN layer as the p-side light guide layer.

Subsequently, a p-InAlGaN layer (having the indium (In) composition of about 0.02 and the aluminum (Al) composition of about 0.09) as a p-type cladding layer was formed by epitaxial growth in the thickness of about 0.40 μm on the p-GaN layer.

Next, a contact layer consisting of a first p$^+$-GaN layer and a second p$^+$-GaN layer having a p-type dopant concentration equal to or higher than that of the first p$^+$-GaN layer was formed on the p-type cladding layer (particularly, on the second p-InAlGaN layer). First, the first p$^+$-GaN layer was formed by epitaxial growth in the thickness of about 0.040 μm on the second p-InAlGaN layer and, thereafter, the second p$^+$-GaN layer having the p-type dopant concentration higher than that of the first p$^+$-GaN layer was formed by epitaxial growth in the thickness of about 0.010 μm on the first p$^+$-GaN layer. In the manner described above, the epitaxial lamination of GaN-based semiconductors was formed on the principal surface of the GaN substrate.

Example 4

A laser diode (corresponding to the GaN-based semiconductor laser device 11) was fabricated in the device structure shown in part (a) of FIG. 5. A GaN substrate with a principal surface of a GaN-based semiconductor was prepared and an epitaxial lamination of GaN-based semiconductors was formed on the principal surface of this GaN substrate by metal organic vapor phase epitaxy. First, a first n-GaN layer was formed by epitaxial growth in the thickness of about 1.1 μm on the principal surface of the GaN substrate. Then, after the formation of the first n-GaN layer, an n-InAlGaN layer (having the indium (In) composition of about 0.02 and the aluminum (Al) composition of about 0.09) as an n-type cladding layer was formed by epitaxial growth in the thickness of about 1.2 μm on the first n-GaN layer.

Next, a second n-GaN layer was formed by epitaxial growth in the thickness of about 0.250 μm on the n-InAlGaN layer. Thereafter, an n-InGaN layer (having the indium (In) composition of about 0.045) as an n-side light guide layer was formed by epitaxial growth in the thickness of about 0.190 μm on the second n-GaN layer. Next, an undoped ud-InGaN layer (having the indium (In) composition of about 0.255) as an active layer was formed by epitaxial growth in the thickness of about 3 nm on the n-InGaN layer.

Thereafter, an undoped ud-InGaN layer (having the indium (In) composition of about 0.02) as a p-side light guide layer was formed by epitaxial growth in the thickness of about 0.075 μm on the active layer. Then a p-InGaN layer (having the indium (In) composition of about 0.02) as a p-side light guide layer was formed by epitaxial growth in the thickness of about 0.025 μm on this undoped ud-InGaN layer. Subsequently, a p-GaN layer was formed by epitaxial growth in the thickness of about 0.200 μm on the p-InGaN layer as the p-side light guide layer.

Subsequently, a p-InAlGaN layer (having the indium (In) composition of about 0.015 and the aluminum (Al) composition of about 0.07) as a p-type cladding layer was formed by epitaxial growth in the thickness of about 0.40 μm on the p-GaN layer.

Next, a contact layer consisting of a first $p^+$-GaN layer and a second $p^+$-GaN layer having a p-type dopant concentration equal to or higher than that of the first $p^+$-GaN layer was formed on the p-type cladding layer (particularly, on the second p-InAlGaN layer). First, the first $p^+$-GaN layer was formed by epitaxial growth in the thickness of about 0.040 μm on the second p-InAlGaN layer and, thereafter, the second $p^+$-GaN layer having the p-type dopant concentration higher than that of the first $p^+$-GaN layer was formed by epitaxial growth in the thickness of about 0.010 μm on the first $p^+$-GaN layer. In the manner described above, the epitaxial lamination of GaN-based semiconductors was formed on the principal surface of the GaN substrate.

Example 5

A laser diode (corresponding to the GaN-based semiconductor laser device 11) was fabricated in the device structure shown in part (b) of FIG. 5. A GaN substrate with a principal surface of a GaN-based semiconductor was prepared and an epitaxial lamination of GaN-based semiconductors was formed on the principal surface of this GaN substrate by metal organic vapor phase epitaxy. First, a first n-GaN layer was formed by epitaxial growth in the thickness of about 1.1 μm on the principal surface of the GaN substrate. Then, after the formation of the first n-GaN layer, an n-InAlGaN layer (having the indium (In) composition of about 0.02 and the aluminum (Al) composition of about 0.09) as an n-type cladding layer was formed by epitaxial growth in the thickness of about 1.2 μm on the first n-GaN layer.

Next, a second n-GaN layer was formed by epitaxial growth in the thickness of about 0.250 μm on the n-InAlGaN layer. Thereafter, an n-InGaN layer (having the indium (In) composition of about 0.06) as an n-side light guide layer was formed by epitaxial growth in the thickness of about 0.150 μm on the second n-GaN layer. Next, an undoped ud-InGaN layer (having the indium (In) composition of about 0.255) as an active layer was formed by epitaxial growth in the thickness of about 3 nm on the n-InGaN layer.

Thereafter, an undoped ud-InGaN layer (having the indium (In) composition of about 0.02) as a p-side light guide layer was formed by epitaxial growth in the thickness of about 0.075 μm on the active layer. Subsequently, a p-GaN layer was formed by epitaxial growth in the thickness of about 0.200 μm on the undoped ud-InGaN layer as the p-side light guide layer.

Subsequently, a p-InAlGaN layer (having the indium (In) composition of about 0.015 and the aluminum (Al) composition of about 0.07) as a p-type cladding layer was formed by epitaxial growth in the thickness of about 0.40 μm on the p-GaN layer.

Next, a contact layer consisting of a first $p^+$-GaN layer and a second $p^+$-GaN layer having a p-type dopant concentration equal to or higher than that of the first $p^+$-GaN layer was formed on the p-type cladding layer (particularly, on the second p-InAlGaN layer). First, the first $p^+$-GaN layer was formed by epitaxial growth in the thickness of about 0.040 μm on the second p-InAlGaN layer and, thereafter, the second $p^+$-GaN layer having the p-type dopant concentration higher than that of the first $p^+$-GaN layer was formed by epitaxial growth in the thickness of about 0.010 μm on the first $p^+$-GaN layer. In the manner described above, the epitaxial lamination of GaN-based semiconductors was formed on the principal surface of the GaN substrate.

In each of Examples 1 to 5, the lasing wavelength of the active layer is not less than 400 nm and not more than 550 nm, but it can be not less than 480 nm and not more than 550 nm and can be not less than 510 nm and not more than 540 nm.

In each of Examples 1 to 5, the active layer has a single quantum well structure including a single quantum well layer or a multiple quantum well structure including a plurality of quantum well layers and a plurality of barrier layers.

In each of Examples 1 to 5, the interface between the n-side light guide layer (n-InGaN layer) and the active layer is inclined toward the m-axis direction from the plane perpendicular to the reference axis extending along the c-axis and, particularly, can be inclined at the angle of not less than 63°, and less than 80°.

In each of Examples 1 to 5, the n-type cladding layer, n-GaN layer, n-side light guide layer, active layer, p-side light guide layer, p-GaN layer, and p-type cladding layer are provided in order on the principal surface of the GaN substrate. In each of Examples 1 to 5, the principal surface of the GaN substrate is inclined at the angle of not less than 63°, and less than 80° toward the m-axis direction from the plane perpendicular to the reference axis extending along the c-axis. Since the interface between the n-side light guide layer (n-InGaN layer) and the active layer is inclined at the angle of not less than 63°, and less than 80° toward the m-axis direction from the plane perpendicular to the reference axis extending along the c-axis, it is suitable for emission of light in the green region.

In each of Examples 1 to 5, the n-type cladding layer is $In_xAl_yGa_{1-x-y}N$ (0<x<0.05 and 0<y<0.20) and the p-type cladding layer is $In_xAl_yGa_{1-x-y}N$ (0≦x<0.05 and 0<y<0.20).

In each of Examples 1 to 5, each of the indium (In) compositions of the n-side and p-side light guide layers is not less than 2% and not more than 6%, but it can be not less than 2% and not more than 5% and can be not less than 2% and not more than 4.5%. The higher the indium (In) compositions of the n-side and p-side light guide layers, the larger the refractive index differences from the n-type cladding layer and the p-type cladding layer, but the more fragile the crystals become. When the principal surface of the GaN substrate is inclined at the angle of not less than 63°, and less than 80° toward the m-axis direction from the plane perpendicular to the reference axis extending along the c-axis, generation of dislocations becomes conspicuous in the range where the indium (In) composition exceeds 6%. In each of Examples 1 to 5, in order to achieve the sufficient refractive index differences between the n-side and p-side light guide layers and the n-type and p-type cladding layers, the indium (In) compositions of the n-side and p-side light guide layers can be set, particularly, in the range of not less than 2% and not more than 6%. Therefore, it is feasible to achieve the sufficient refractive index differences between the light guide layers and the cladding layers and also ensure sufficient stiffness of crystals.

In each of Examples 1 to 5, the film thickness of the n-side light guide layer is in the range of not less than 65% and not more than 85% of the total of the film thickness of the n-side light guide layer and the film thickness of the p-side light guide layer. For example, in Example 1 and Example 2, the film thickness of the n-side light guide layer is approximately 71% of the total of the film thickness of the n-side light guide layer and the film thickness of the p-side light guide layer. In Example 3, the film thickness of the n-side light guide layer is approximately 67% of the total of the film thickness of the n-side light guide layer and the film thickness of the p-side light guide layer.

In each of Examples 1 to 5, the n-type dopant is, for example, silicon (Si) and the dopant concentration of the n-type dopant is about $5 \times 10^{17}$ cm$^{-3}$. When the dopant concentration of the n-type dopant is below this value of $5 \times 10^{17}$ cm$^{-3}$, the electrical resistance becomes relatively large. In each of Examples 1 to 5, the p-type dopant is, for example, magnesium (Mg) and the dopant concentration of the p-type dopant is about $3 \times 10^{18}$ cm$^{-3}$. When the dopant concentration of the p-type dopant is below this value of $3 \times 10^{18}$ cm$^{-3}$, the electrical resistance becomes relatively large.

In each of Examples 1 to 5, the absorption coefficient of the n-InGaN layer as the n-side light guide layer was about 6 cm$^{-1}$, that of the ud-InGaN layer as the p-side light guide layer about 1 cm$^{-1}$, and that of the p-GaN layer about 30 cm$^{-1}$. The absorption coefficients of the epitaxial layers can be measured, for example, by spectral ellipsometry.

In each of Examples 1 to 5, the ud-InGaN layer as the p-side light guide layer can prevent magnesium (Mg) as the p-type dopant from diffusing into the active layer. The film thickness of the ud-InGaN layer as the p-side light guide layer necessary for prevention of diffusion of magnesium (Mg) is about 0.075 μm. When the film thickness of the ud-InGaN layer as the p-side light guide layer exceeds this value of 0.075 μm, the ud-InGaN layer as the p-side light guide layer has relatively high electrical resistance.

In each of Examples 1 to 5, an insulating film (e.g., an SiO$_2$ film) having a stripe window with the width of about 10 μm was formed on the epitaxial lamination by wet etching and then an anode electrode (p-side electrode) and a pad electrode of Pd were formed by evaporation. After this, a cathode electrode (n-side electrode) and a pad electrode of Al were formed on the back surface by evaporation. The substrate product in each of Examples 1 to 3 fabricated as described above was fractured at the interval of about 600 μm to separate out a laser bar, and a reflecting film comprised of a dielectric multilayer film was deposited on each of end faces of a resonator of the laser bar. The fractured surfaces are planes perpendicular to {20-21} plane and {11-20} plane. The dielectric multilayer film is comprised, for example, of SiO$_2$/TiO$_2$. The reflectance of the front end face is about 80% and that of the rear end face about 95%.

Figure 6:
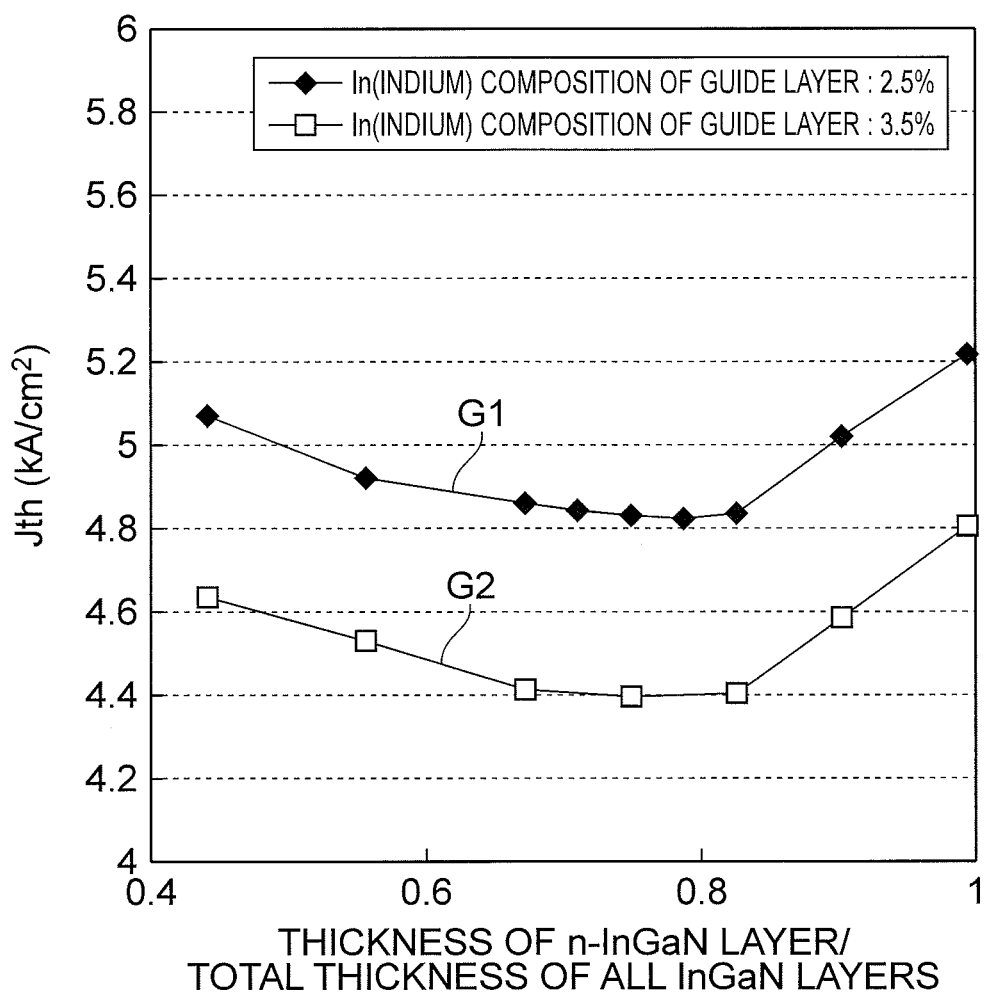
FIG. 6 is a drawing showing a relationship of threshold current versus ratio of film thickness of an n-InGaN layer to total film thickness of all InGaN layers.

FIG. 6 shows the relationship of threshold current Jth (A/cm$^2$) versus ratio of the film thickness of the n-InGaN layer (n-side light guide layer) to the total of the film thicknesses of all the InGaN layers (n-side and p-side light guide layers), in the laser diode of Example 1 and the laser diode of Example 2. Graph G1 in FIG. 6 shows the relationship of threshold current versus ratio of the film thickness of the n-InGaN layer to the total film thickness of all the InGaN layers, with change in film thickness of the n-InGaN layer (n-side light guide layer) and with the total film thickness of all the InGaN layers (n-side and p-side light guide layers) being kept constant (e.g., about 250 nm), in the laser diode of Example 1. Graph G2 in FIG. 6 shows the relationship of threshold current versus ratio of the film thickness of the n-InGaN layer to the total film thickness of all the InGaN layers, with change in film thickness of the n-InGaN layer (n-side light guide layer) and with the total film thickness of all the InGaN layers (n-side and p-side light guide layers) being kept constant (e.g., about 250 nm), in the laser diode of Example 2. It is seen with reference to the graphs G1, G2 that in the examples where the indium (In) composition of the n-InGaN layer is either of 2.5% (Example 1) and 3.5% (Example 2), the threshold current is relatively low when the ratio of the film thickness of the n-InGaN layer to the total film thickness of all the InGaN layers is in the range of not less than 0.65 and not more than 0.85 (i.e., not less than 65% and not more than 85%).

Figure 7:
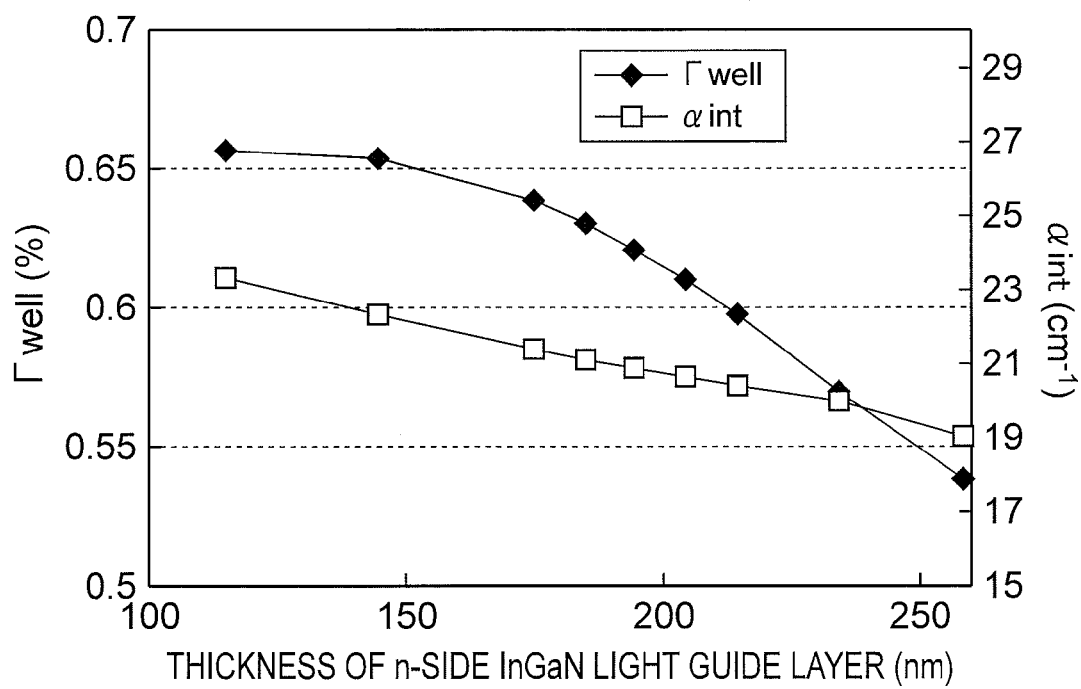
FIG. 7 is a drawing showing a relationship of film thickness of the n-InGaN layer versus ratio of light passing through an active layer and attenuation rate of light passing through a waveguide.

As shown in FIG. 7, as the film thickness of the n-InGaN layer (n-side light guide layer) becomes larger than that of the ud-InGaN layer (p-side light guide layer), deviation of position of the active layer increases (to make the n-side and the p-side thereof significantly asymmetric), so as to reduce the ratio of light passing through the active layer (Γwell) and the attenuation rate (αint) of light passing through the waveguide. For example, when light with intensity Int travels by k (cm) in the waveguide, the intensity of this light attenuates according to Int×e$^{αint×k}$ (where "e" is the base of natural logarithm (Napier constant)). However, we discovered that the loss of light due to the aforementioned asymmetry between the n-side and the p-side is suitably suppressed, as shown in FIG. 6, as long as the film thickness of the n-InGaN layer (n-side light guide layer) falls within the range of not less than 65% and not more than 85% of the total of the film thickness of the n-InGaN layer (n-side light guide layer and the film thickness of the ud-InGaN layer (p-side light guide layer), as in Example 1 and Example 2. The result shown in FIG. 7 is the measurement result of Γwell (%) and αint (cm$^{-1}$) obtained with change in film thickness of the n-InGaN layer (n-side light guide layer) and with the film thickness of the ud-InGaN layer (p-side light guide layer) being kept constant, in Example 1. The internal loss (αint) in the waveguide can be measured, for example, by the Hakki-Paoli method. The position of the waveguide is located below the aperture 39a shown in part (a) of FIG. 1.

As described above, the present invention provides the GaN-based semiconductor laser device with reduced threshold current and the method for fabricating the GaN-based semiconductor laser device.

The principle of the present invention was illustrated and explained in the preferred embodiments thereof, but it should be noted that it is recognized by those skilled in the art that the present invention can be modified in arrangement and details without departing from the principle of the invention. The present invention is not limited to the specific configurations disclosed in the embodiments of the present invention. Therefore, we claim all modifications and changes resulting from the scope of claims and the scope of spirit thereof.

What is claimed is:

1. A gallium nitride (GaN)-based semiconductor laser device comprising:
    an n-type cladding layer of an n-type GaN-based semiconductor;
    a first light guide layer of a GaN-based semiconductor provided on the n-type cladding layer;
    an active layer of a GaN-based semiconductor provided on the first light guide layer;
    a second light guide layer of a GaN-based semiconductor provided on the active layer; and
    a p-type cladding layer of a p-type GaN-based semiconductor provided on the second light guide layer,
    wherein a lasing wavelength of the active layer is not less than 400 nm and not more than 550 nm,
    wherein the first and second light guide layers both contain indium,
    wherein each of indium compositions of the first and second light guide layers is not less than 2% and not more than 6%, wherein a film thickness of the first light guide layer is in the range of not less than 65% and not more than 85% of a total of the film thickness of the first light guide layer and a film thickness of the second light guide layer, and wherein the first light guide layer and the second light guide layer are in contact with the active layer.

2. The GaN-based semiconductor laser device according to claim 1, wherein the n-type cladding layer is $In_xAl_yGa_{1-x-y}N$ (0<x<0.05 and 0<y<0.20), and wherein the p-type cladding layer is $In_xAl_yGa_{1-x-y}N$ (0≦x<0.05 and 0<y<0.20).

3. The GaN-based semiconductor laser device according to claim 1, wherein the active layer has a single quantum well structure including a single quantum well layer.

4. The GaN-based semiconductor laser device according to claim 1, wherein the active layer has a multiple quantum well structure including a plurality of quantum well layers and a plurality of barrier layers.

5. The GaN-based semiconductor laser device according to claim 1, wherein an interface between the first light guide layer and the active layer is inclined toward the m-axis direction from a plane perpendicular to a reference axis extending along the c-axis.

6. The GaN-based semiconductor laser device according to claim 5, wherein the interface between the first light guide layer and the active layer is inclined at an angle of not less than 63°, and less than 80° toward the m-axis direction from the plane perpendicular to the reference axis.

7. The GaN-based semiconductor laser device according to claim 5, further comprising a substrate with a principal surface of a GaN-based semiconductor, wherein the n-type cladding layer, the first light guide layer, the active layer, the second light guide layer, and the p-type cladding layer are provided in order on the principal surface, and wherein the principal surface is inclined at an angle of not less than 63°, and less than 80° toward the m-axis direction from the plane perpendicular to the reference axis.

8. The GaN-based semiconductor laser device according to claim 1, wherein the lasing wavelength of the active layer is not less than 480 nm and not more than 550 nm.

9. The GaN-based semiconductor laser device according to claim 1, wherein the lasing wavelength of the active layer is not less than 510 nm and not more than 540 nm.

10. The GaN-based semiconductor laser device according to claim 1, wherein the indium composition of the first light guide layer is not less than 2% and not more than 5%.

11. The GaN-based semiconductor laser device according to claim 1, wherein the indium composition of the first light guide layer is not less than 2% and not more than 4.5%.

12. The GaN-based semiconductor laser device according to claim 1, wherein the indium composition of the second light guide layer is not less than 2% and not more than 5%.

13. The GaN-based semiconductor laser device according to claim 1, wherein the indium composition of the second light guide layer is not less than 2% and not more than 4.5%.

14. A method for fabricating a GaN-based semiconductor laser device, comprising:

a step of forming an n-type cladding layer of an n-type GaN-based semiconductor;

a step of forming a first light guide layer of a GaN-based semiconductor on the n-type cladding layer;

a step of forming an active layer of a GaN-based semiconductor on the first light guide layer;

a step of forming a second light guide layer of a GaN-based semiconductor on the active layer; and a step of forming a p-type cladding layer of a p-type GaN-based semiconductor on the second light guide layer, wherein a lasing wavelength of the active layer is not less than 400 nm and not more than 550 nm, wherein the first and second light guide layers both contain indium, wherein each of indium compositions of the first and second light guide layers is not less than 2% and not more than 6%, wherein a film thickness of the first light guide layer is in the range of not less than 65% and not more than 85% of a total of the film thickness of the first light guide layer and a film thickness of the second light guide layer, and wherein the first light guide layer and the second light guide layer are in contact with the active layer.

15. The method according to claim 14, wherein the n-type cladding layer is $In_xAl_yGa_{1-x-y}N$ (0<x<0.05 and 0<y<0.20), and wherein the p-type cladding layer is $In_xAl_yGa_{1-x-y}N$ (0≦x<0.05 and 0<y<0.20).

16. The method according to claim 14, wherein the active layer has a single quantum well structure including a single quantum well layer.

17. The method according to claim 14, wherein the active layer has a multiple quantum well structure including a plurality of quantum well layers and a plurality of barrier layers.

18. The method according to claim 14, wherein an interface between the first light guide layer and the active layer is inclined toward the m-axis direction from a plane perpendicular to a reference axis extending along the c-axis.

19. The method according to claim 18, wherein the interface between the first light guide layer and the active layer is inclined at an angle of not less than 63°, and less than 80° toward the m-axis direction from the plane perpendicular to the reference axis.

20. The method according to claim 18, further comprising:

a step of preparing a substrate with a principal surface of a GaN-based semiconductor, wherein the n-type cladding layer, the first light guide layer, the active layer, the second light guide layer, and the p-type cladding layer are provided in order on the principal surface of the substrate, and wherein the principal surface is inclined at an angle of not less than 63°, and less than 80° toward the m-axis direction from the plane perpendicular to the reference axis.

21. The method according to claim 14, wherein the lasing wavelength of the active layer is not less than 480 nm and not more than 550 nm.

22. The method according to claim 14, wherein the lasing wavelength of the active layer is not less than 510 nm and not more than 540 nm.

23. The method according to claim 14, wherein the indium composition of the first light guide layer is not less than 2% and not more than 5%.

24. The method according to claim 14, wherein the indium composition of the first light guide layer is not less than 2% and not more than 4.5%.

25. The method according to claim 14, wherein the indium composition of the second light guide layer is not less than 2% and not more than 5%.

26. The method according to claim 14, wherein the indium composition of the second light guide layer is not less than 2% and not more than 4.5%.

* * * * *